United States Patent [19]

Maeda et al.

[11] Patent Number: 4,751,146
[45] Date of Patent: Jun. 14, 1988

[54] PRINTED CIRCUIT BOARDS

[75] Inventors: Masahiko Maeda, Tokyo; Kazuya Nagata, Kanagawa; Yasutoki Saitou, Kanagawa; Taketsugu Ootani, Kanagawa; Yuichi Sakon, Tokyo, all of Japan

[73] Assignee: Showa Denko Kabushiki Kaisha, Tokyo, Japan

[21] Appl. No.: 883,662

[22] Filed: Jul. 9, 1986

Related U.S. Application Data

[63] Continuation-in-part of Ser. No. 875,034, Jun. 16, 1986.

[30] Foreign Application Priority Data

| Jul. 9, 1985 | [JP] | Japan | 60-149193 |
| Feb. 3, 1986 | [JP] | Japan | 61-20267 |
| Feb. 7, 1986 | [JP] | Japan | 61-24089 |

[51] Int. Cl.$^4$ .................. B32B 27/08; B32B 15/08; B32B 3/00
[52] U.S. Cl. .................. 428/475.8; 428/209; 428/461; 428/901
[58] Field of Search .................. 428/209, 461, 475.8, 428/901

[56] References Cited

U.S. PATENT DOCUMENTS

| 4,058,647 | 11/1977 | Inoue et al. | 428/474 |
| 4,230,830 | 10/1980 | Tanny et al. | 525/222 |
| 4,410,612 | 10/1983 | Goff et al. | 430/18 |
| 4,413,037 | 11/1983 | Tobias | 428/461 |
| 4,416,944 | 11/1983 | Adur | 428/349 |
| 4,423,117 | 12/1983 | Machinis, Jr. et al. | 428/475.8 |
| 4,477,532 | 10/1984 | Schmulker et al. | 428/441 |

Primary Examiner—John E. Kittle
Assistant Examiner—Patrick J. Ryan
Attorney, Agent, or Firm—Sughrue, Mion, Zinn, Macpeak, and Seas

[57] ABSTRACT

A heat resistant printed circuit board is disclosed which comprises a laminate of:

(A) a thin-walled body having a thickness of from 0.2 μm to less than 5 mm and containing a cross-linked product of a mixture of (a) 1 to 99 wt. % of an ethylenic copolymer (A) comprised of 30 to 99.5 wt. % of ethylene, and an oxirane ring-containing compound having at least one double bond and having 6 to 30 carbon atoms, and (b) 99 to 1 wt. % of an ethylenic copolymer (B) comprised of 30 to 99.5 wt. % of ethylene, and a comonomer selected from the group consisting of unsaturated monocarboxylic acids, unsaturated dicarboxylic acids, unsaturated dicarboxylic acid anhydrides, and half esters of unsaturated dicarboxylic acids; and (B) an electrically conductive metal layer having a thickness of from 100 Å to 400 μm.

The boards have excellent heat resistance, electrical insulating properties, flexibility, chemical resistance, dimensional stability, etc.

9 Claims, 3 Drawing Sheets

PRINTED CIRCUIT BOARDS

CROSS-REFERENCE TO RELATED APPLICATION

This is a continuation-in-part application of an earlier-filed application serial No. 875,034 filed June 16, 1986, entitled "MOLDED PRODUCT HAVING PRINTED CIRCUIT BOARD."

FIELD OF THE INVENTION

This invention relates to printed circuit boards exhibiting excellent adhesion of a metal layer forming a circuit to a substrate at temperatures of from normal room temperature (about 20° C.) to relatively high temperatures (e.g., 360° C.).

BACKGROUND OF THE INVENTION

Recently, electronic equipment has been rapidly developed to be more compact, more lightweight, thinner, and more densely mounted. Especially, printed circuit boards have been commercialized in equipment such as radios, etc. and are presently undergoing expanded use in industrial equipment such as telephones, electronic computers, etc., due to their ability to be mass-produced and their high reliability.

Flexible printed circuit boards were originally used as substitutes for wiring and cables, but since they have flexibility and hence not only can be highly densely mounted in narrow, spaces, but also can withstand repeated bendings, their uses have been expanded as circuits for movable parts of electronic equipment, cables and composite parts imparted with connector functions.

At present, those used in equipment such as cameras, electronic calculators, telephones, printers, etc., typically are formed of a flexible copper-clad board composed of a polyimide or polyester film of about 25 µm in thickness and an electrolytic copper foil or foils of about 35 µm thickness deposited on either or both surfaces thereof and having a circuit pattern formed thereon. In addition, those obtained by providing this circuit pattern with through hole plating and further providing a coating of non-metallic substances (so called "cover lay coating") on both surfaces or the outer layer are also used.

For currently used flexible printed circuit boards, films of a polyimide or polyester resin are generally used as a base material, as described in, for example, U.S. Pat. Nos. 4,377,652 and 3,322,881, Japanese Patent Publication Nos. 29793/72 and 40339/77, and Japanese Patent Application (OPI) Nos. 1123/80 and 73034/76.

However, a coefficient of thermal expansion of the polyester resin is high at 20°-250° C., and thus it lacks through hole connection reliability. Further, since curing is sometimes effected by a steam press at 170° C. during production, there is a tendency, when laminated, that not only the adhesion between the resin layers, but also the flexibility thereof, are lowered.

On the other hand, the polyimide film has an advantage that it can be easily soldered at an ordinary soldering temperature (260° C. or higher), but has a disadvantage that since the surface activity is low, bonding with the metal foil is very difficult. In order to solve this adhesion problem, generally a method is practiced of bonding using an adhesive after treating the film surface by chemical treatment using sodium hydroxide, a chromic acid mixture, aluminum hydroxide, etc. However, even when bonding is conducted by such a method, the board obtained generally does not have satisfactory adhesion as a printed circuit board and is poor in chemical resistance, heat resistance, etc. and thus it has various drawbacks, for example, the copper foil is loosened and comes off by etching treatment, solder flow, etc.

In a method of bonding with a metal foil using a thermosetting adhesive having good heat resistance (e.g., an epoxy resin), it is necessary to overlay the adhesive-applied polyimide film with a metal foil and cure the laminate by heating and compression-treating by a press for about 1–20 hours, and thus there are severe problems with respect to productivity, cost, etc.

Also in the process for the production of printed circuit boards, the conventional process of etching a copper-clad laminate has begun to give way to an additive process of directly drawing a circuit pattern on a resin board by electroless plating by applying the plating technique on plastics and also a substractive process which combines such plating and an etching process. The reason why this additive process has come to be widely employed is that it is based on an effective process of simultaneously forming through holes and pattern plating on a resin laminate which is available in a small range of variety in large quantities, and also for the last several years, the functions of reverse pattern resist inks, etc., have been improved and it has become possible to obtain highly developed fine lines. Recently, a resistless process has also been developed which comprises directly irradiating ultraviolet light on a photoreactive catalyst incorporated in an adhesive layer through a photomask to deposit metal nuclei, thus effecting electroless plating.

However, with conventional boards composed of paper - phenolic resin, glass - epoxy resin, polyimide resin, etc., used in the above additive process, since the adhesion with the plating is poor, blisters and peel-off can occur, or since the coefficient of thermal expansion in the thickness direction is great, when thermal stress is applied, cracking often takes place, especially in a minute pattern plated part. Further, on making holes in a laminate, it is the present situation that smear (misalignment of holes through the laminate) is generated and interferes with the connection with the plating, and thus the connection reliability is deteriorated. Furthermore, in the etching or plating step, since great quantities of various aqueous solutions and washing water are used, it is an essential requirement that the dimensional change when wet be small.

Furthermore, copper-clad laminates are mainly used as printed circuit boards, and demand therefor has recently been increasing. Heretofore, a phenol resin-impregnated base material and an epoxy resin-impregnated base material have been used for the copper-clad laminates.

However, printed circuit boards employing base materials impregnated with these resins are not always satisfactory in various characteristics; for example, the adhesive power between the copper foil and the base material, the dimensional stability, and the electrical characteristics (especially electrical characteristics after moisture absorption treatment) are greatly lowered, and so on. Therefore, they cannot fully satisfy the demands for densification and higher reliability accompanying recent developments in the electronics fields, and thus printed circuit boards having improved capabilities are anxiously desired.

For improving characteristics such as heat resistance and dimensional stability, fibrous materials have been introduced composed of glass fiber, such as glass paper, filaments and staple fibers, or base materials obtained by impregnating glass fabrics with a phenolic resin or an improved epoxy resin has been used. However, in these circuit boards, although the dimensional stability, heat stability, etc., can be improved to some extent by the presence of these inorganic fibrous materials in the base materials, the moisture resistance, electrical characteristics, etc., cannot be substantially improved. Further, since there is no sufficient adhesive for adhering these base materials and the copper foil, it is the present situation that the improvements in the properties of the base material itself are not sufficiently manifested when the copper foil and the laminate are formed.

Further, where thermoplastic resins are used as base materials, the dimensional stability of the boards obtained is remarkably influenced by the bonding conditions using either heat fusion or the adhesive. In addition, since residual stress of the adhesive layer acts to generate shrinkage at high temperatures, bending, twisting, etc., may be brought about. In order to overcome this problem, those having a glass cloth or mat, an inorganic fiber cloth, etc. incorporated in a base material resin are employed. However, since adhesion and compatibility between the thermoplastic resin and the glass fiber are extremely poor, it is often observed that when repeatedly bent, peel-off occurs between the resin and the glass fiber, thus causing rupture, or break-down of the circuit.

Under such circumstances, there has been a demand for a printed circuit board having not only good dimensional stability at high temperatures, but also excellent electrical characteristics, and still being highly reliable and inexpensive.

In the recent years, with the advance in densification, multiple layering has been developed accordingly. In particular, in a structure of three or more layers, through holes are utilized in order to connect different electrically conductive layers. For example, a plated through hole process, an additive process, a multiwire process, etc., are conducted, and the through holes are utilized also in mounting electronic parts, for example, in a clearance process, a pin inserting process, etc.

In these through holes, it is general to form a conductor by a plating technique, but there are problems in respect to moisture resistance, bond strength, etc. and hence disconnection occurs or the product yield is very poor, and therefore, a resin having good adhesion (i.e., as an insulating layer) has been sought.

Moreover, thermosetting resin laminates generally used as printed circuit boards have not only electrical characteristics but also heat stability, and also, by making the best use of the feature of having only a small dimensional change in the thickness direction, they are used as double-sided through hole printed circuit boards. Heretofore, thermosetting laminates that have been used include laminates obtained by impregnating a base material such as paper, cloth, glass fiber, etc., with a thermosetting resin such as a phenolic resin, an epoxy resin, an unsaturated polyester resin, etc., then drying and thereafter laminating the desired number thereof and finally heating and compression-treating them to mold them together using a thermal press machine. Further, a disadvantage of poor heat dissipating properties is ameliorated by incorporating a good heat conductive powder filler.

When using these thermosetting laminates as insulators for printed circuit boards, it is necessary to laminate an electrically conductive metal foil via an adhesive layer on the laminate. As the electrically conductive metal foil, an electrolytic copper foil or a milled copper foil is used. However, finding an appropriate adhesive for bonding the copper foil and the thermosetting resin is a problem. That is, in general, an epoxy resin is used as the adhesive, but since volatile substances are contained in the adhesive, not only are blisters generated and the conductive layer comes off on heating, but also the dielectric strength is decreased, and so forth. Inter alia, the greatest disadvantages are heat resistance and moisture resistance, and since such properties in the adhesive layers are poorer than those in the thermosetting laminates, it is the present situation that the desirable characteristics of the laminates cannot be fully utilized. Furthermore, since a step of coating the adhesive on the conductor or the laminate is required, the processing steps are very complicated and also there are drawbacks such as that the bonding power is reduced, by, e.g., uneven coating of the adhesive, etc., and that it takes a prolonged time for the adhesive to cure, etc.

Under such circumstances, the development of an adhesive layer which can bond a thermosetting resin laminate and a conductor and has excellent heat resistance, moisture resistance, and insulating properties has been sought.

Some of the present inventors conducted extensive investigations in order to overcome the above-described problems and provided a printed circuit board having good heat resistance and also excellent electrical insulating properties, as described in European Patent Application No. 0148157-A (which corresponds to U.S. Patent Application Serial No. 688,924 filed Jan. 4, 1985), which comprises a laminate of:

(A) a thrn-wall body having a thickness of from 3 $\mu$m to less than 5 mm which is a crosslinked product of a mixture comprised of (1) at least one of an ethylene-acrylic acid copolymer and an ethylene-methacrylic acid copolymer (hereinafter collectively referred to as "copolymer (1)") and (2) a saponified product of an ethylene-vinyl acetate copolymer (hereinafter referred to as "copolymer (2)"), wherein the mixing proportion of copolymer (1) in the mixture is from 20 to 80% by weight and the mixture is crosslinked such that after the extraction of the crosslinked product with a boiled toluene for three hours the amount of residue having a size of 0.1 $\mu$m or more is at least 80% by weight based on the weight of the crosslinked product; and (B) an electrically conductive metal layer having a thickness of from 100 Å to 400 $\mu$m.

By heating copolymers (1) and (2) at a high temperature a thin-wall body having good heat resistance can be obtained. However, when the thin-wall body is laminated on an electrically conductive metal layer or interposed between the metal layer and a layer of other material(s), to prepare a printed circuit board, uniform adhesive strength is difficult to obtain between the thin-wall body and the metal layer or the layer of other material(s).

SUMMARY OF THE INVENTION

Accordingly, the present inventors have conducted extensive investigations in order to overcome the above-described problems and provide printed circuit boards having good heat resistance and also excellent electrical insulating properties, and, as a result, have discovered a printed circuit board having excellent electrical insulating properties and good durability, and thereby having accomplished this invention, viz., a printed circuit board comprising a laminate of:

(A) a thin-wall body having a thickness of from 0.2 μm to less than 5 mm and containing a crosslinked product of a mixture (a) 1 to 99 wt % of an ethylenic copolymer (A) comprised of 30 to 99.5 wt % of ethylene, and an oxirane ring-containing compound having at least one double bond and having 6 to 30 carbon atoms (hereinafter referred to as "comonomer (1)") and (b) 99 to 1 wt % of an ethylenic copolymer (B) comprised of 30 to 99.5 wt % of ethylene, and a comonomer selected from the group consisting of unsaturated monocarboxylic acids, unsaturated dicarboxylic acids, unsaturated dicarboxylic acid anhydrides and half esters of unsaturated dicarboxylic acids (hereinafter referred to as "comonomer (2)") (hereinafter referred to as "layer A"); and (B) an electrically conductive metal layer having a thickness of from 100 Å to 400 vm (hereinafter referred to as "layer B").

DETAILED DESCRIPTION OF THE INVENTION

Figure 1:
FIG. 1 through FIG. 14 are cross-sectional views of representative examples illustrating the printed circuit board layer structures according to this invention.

This invention is more particularly described below with respect to the respective constituting components.
(A) Layer A Layer A according to this invention is, as described hereinafter, obtained by crosslinking a thin-wall body comprised of a mixture of an ethylene/comonomer (1) copolymer (A) and an ethylene/comonomer (2) copolymer (B), optionally further mixed with a heat-conductive inorganic filler, glass fiber, or a glass cloth or mat. In forming the mixture and the thin-wall body, it is essential to substantially inhibit crosslinking of the copolymer (A) and copolymer (B) (that is, to preclude formation of fish-eyes), and in producing the printed circuit board of this invention, crosslinking of the thin-wall body is effected.

(1) Ethylenic Copolymer (A)

Ethylenic copolymer (A) used in this invention is an ethylenic copolymer comprised of ethylene and comonomer (1), or further with an unsaturated carboxylic acid ester and/or a vinyl ester (hereinafter referred to as "comonomer (3)"). Comonomer (1) is an oxirane ring-containing compound having at least one double bond and having 6 to 30 carbon atoms.

Examples of comonomer (1) are those represented by the following general formulae (I) to (III):

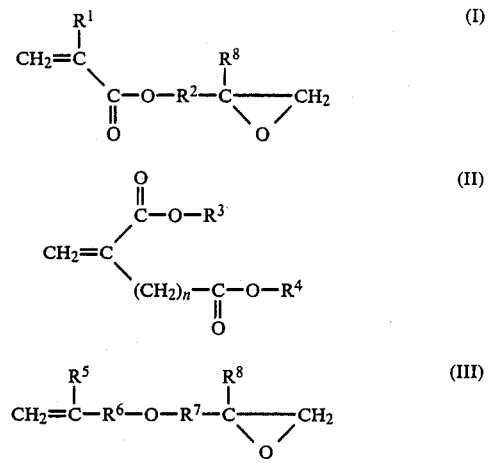

wherein $R^1$, $R^5$ and $R^8$ which may be the same or different, each represents a hydrogen atom or a methyl group; $R^2$, $R^6$ and $R^7$ which may also be the same or different, each represents a straight chain or branched chain alkylene group having 1 to 12 carbon atmos; $R^3$ and $R^4$ each represents a straight chain or branched chain alkyl group having up to 12 carbon atoms and a straight chain or branched chain alkyl group having 2 to 12 carbon atoms and having an oxirane group at the terminal, provided that at least one of $R^3$ and $R^4$ has the alkyl group having an oxirane group; and n is 0 or 1.

Examples of the monomer represented by formulae (I) to (III) include butenecarboxylic acid monoglycidyl ester, glycidyl methacrylate, glycidyl acrylate, methylglycidyl acrylate, methylglycidyl methacrylate, itaconic acid glycidyl ester, 7,8-epoxy-1-octyl methacrylate, itaconic acid methylglycidyl ester, 7,8-epoxy-1-octyl vinyl ether, vinyl glycidyl ether, allyl glycidyl ether, and 2-methyl-2-propenyl glycidyl ether.

Also, as comonomer (3) there may be mentioned unsaturated carboxylic acid esters containing up to 30 carbon atoms, preferably up to 20 carbon atoms, more preferably up to 12 carbon atoms, such as methyl (meth)acrylate, ethyl (meth)acrylate, alkoxyalkyl (meth)acrylate, n-butyl (meth)acrylate, n-hexyl (meth)acrylate, n-octyl (meth)acrylate, and 2-ethylhexyl (meth)acrylate; and vinyl esters containing up to 30 carbon atoms, preferably up to 20 carbon atoms, more preferably up to 12 carbon atoms, such as vinyl acetate, vinyl propionate, and isopropenyl acetate.

(2) Ethylenic Copolymer (B)

Ethylenic copolymer (B) used in the present invention is an ethylenic copolymer comprised of ethylene and comonomer (2) or further with comonomer (3).

Typical examples of comonomer (2) include unsaturated monocarboxylic acids containing up to 25 carbon atoms, preferably 3 to 10 carbon atoms, as acrylic acid, methacrylic acid, and crotonic acid; unsaturated dicarboxylic acids containing 4 to 50 carbon atoms, preferably 4 to 30 carbon atoms, more preferably 4 to 20 carbon atoms, such as maleic acid, fumaric acid, tetrahydrophthalic acid, itaconic acid, citraconic acid, 4-methylcyclohexane-4-en-1,2-dicarboxylic acid, and bicyclo(2,2,1)hepta-5-en-2,3-dicarboxylic acid, and anhydrides of these unsaturated dicarboxylic acids.

Of ethylenic copolymer (B), the copolymers of ethylene and an unsaturated dicarboxylic acid anhydride and the copolymers of the above monomers and comonomer (3), i.e., an unsaturated carboxylic acid ester and/or a vinyl ester, may be subjected to hydrolysis and/or alcohol modification to partially or wholly convert the dicarboxylic acid anhydride unit in these copolymers into dicarboxylic acid unit or half ester unit.

The hydrolysis can be carried out by reacting ethylenic copolymer (B) with water generally at a temperature of 80° to 100° C. for 0.5 to 10 hours (preferably 2 to 6 hours, more preferably 3 to 6 hours) in the presence of a catalyst such as a tertiary amine (e.g., triethylamine) in an organic solvent which can dissolve the copolymer, and neutralizing the resulting solution with an acid.

The alcohol modification can be carried out according to the solution process or kneading process described below.

The solution process is a process wherein ethylenic copolymer (B) is reacted with an alcohol in the presence or absence (in which case the reaction is slow) of the above described catalyst at a reflux temperature of the alcohol generally for 2 minutes to 5 hours (preferably 2 minutes to 2 hours, more preferably 15 minutes to 1 hour) in an organic solvent as in the case of the hydrolysis.

On the other hand, the kneading process is a process wherein ethylenic copolymer (B) is allowed to react by kneading with about 0.01 to 1.0 part by weight (preferably 0.05 to 0.5 part by weight) on the basis of 100 parts by weight of the copolymer (B) of a tertiary amine and about 0.1 to 3.0 moles (preferably 1.0 to 2.0 moles) of an alcohol per mole of dicarboxylic acid anhydride unit in the copolymer (B) at a temperature higher than the melting point of the copolymer (B) but lower than the boiling point of the alcohol used, for several minutes to several tens minutes (preferably 10 minutes to 30 minutes) by means of a kneading machine such as Banbury mixer, extruder, etc. that are commonly used in the fields of rubber, synthetic resin, etc.

Examples of the alcohol used in the above described alcohol modification include straight chain or branched chain alcohols containing preferably 1 to 12 carbon atoms such as methyl alcohol, ethyl alcohol, and primary butyl alcohol.

In the case of the hydrolysis as well as the alcohol modification, the % conversion to dicarboxylic acid and the % esterification to half ester each is preferably 0.5 to 100%, and more preferably 10.0 to 100%.

The content (copolymerization ratio) of the ethylene in these copolymers (A) and (B) is 30 to 99.5 wt %, preferably 30 to 99.0 wt %, and more preferably 35 to 99.0 wt %.) The content of comonomer (1) (i.e., the oxirane ring-containing compound) in the copolymer (A) is 0.1 to 70 wt %, preferably 0.5 to 70 wt %, more preferably 0.5 to 60 wt %, and most preferably 0.5 to 40 wt %. If the content of comonomer (1) is less than 0.1 wt %, when crosslinked with ethylenic copolymer (B) by heating, not only does the crosslinking become incomplete, but also the adhesion to the metal layer becomes insufficient. Whereas, even if the content exceeds 70 wt %, the characteristic features of this invention may be manifested, but it is not preferred from the economically standpoints. Further, the total content of comonomer (2) (i.e., the monocarboxylic acid, the dicarboxylic acid, the acid anhydride and the half ester) in the copolymer (B) is 0.1 to 70 wt %, preferably 0.5 to 70 wt %, more preferably 0.5 to 60 wt %, and most preferably 0.5 to 40 wt %, for the same reason as in the case of the above described copolymer (A). Further, when the copolymer containing the above described unsaturated carboxylic acid ester and/or vinyl ester (comonomer (3)) is used, the total content of these esters is up to 69.9 wt %, and preferably less than 60 wt %, If the content exceeds 69.9 wt %, the softening point of the copolymer rises, so that the fluidity is deteriorated below 150° C., and further it is not economical.

The melt index (measured according to ASTM D-1238 under Condition E; hereinafter referred to as "M.I.") of the above described copolymers (A) and (B) is generally 0.01 to 1000 g/10 min., preferably 0.05 to 500 g/10 min., more preferably 0.1 to 500 g/10 min., and most preferably 0.1 to 300/10 min. When those copolymers having the M.I. of less than 0.01 g/10 min. are used, not only is the homogeneous mixing of these copolymers difficult, but also the moldability of the resulting mixture is not good.

Of these ethylenic copolymers, where they are prepared by a copolymerization process, ethylene and comonomer (1) or comonomer (2), with or without comonomer (3),are copolymerized at a temperature of 120° to 260° C. under a high pressure of usually 500 to 2500 kg/cm$^2$ in the presence of a free-radical generator (for example, organic peroxide). Such a process is well known. Also, the process wherein hydrolysis and/or alcohol modification are carried out for the preparation of the above described copolymer (B) is well known.

(3) Preparation of Mixture
(a) Mixing Ratio

When preparing the mixture of this invention, the mixing ratio (by weight) of ethylenic copolymer (A) to ethylenic copolymer (B) is 1/99 to 99/1, preferably 5/95 to 95/5, and more preferably 10/90 to 90/10. In the case where the mixing ratio is less than 1/99 or exceeds 99/1, when the mixture is crosslinked by the later described process, the crosslinking is insufficient, so that the resulting thin-wall body does not exhibit good adhesion to the conductive metal layer and a layer of other material(s) as later described.

(b) Mixing Method

The mixture can be obtained by homogeneously mixing ethylenic copolymer (A) and ethylenic copolymer (B) in accordance with, for example, the dry blending method using a mixer such as a Henschel mixer which is widely used in the field of olefinic polymer, or the melt kneading method using a mixer such as a Banbury mixer, kneader, screw type extruder, or roll mill. More homogeneous mixture can be obtained by melt kneading the mixture which has been dry blended. In the melt kneading it is important that a crosslinking reaction does not substantially take place between ethylenic copolymer (A) and ethylenic copolymer (B). If the crosslinking occur, when the resulting mixture is processed by molding as later described, not only does the moldability become poor but also the heat resistance of the molded product is lowered. For the reason, the melt kneading temperature is from room temperature (20° C.) to 150° C., preferably below 140° C., though it varies depending on the kind and the viscosity of the ethylenic polymers used. When the melt kneading is carried out at a relatively high temperature (e.g., 100° to 150° C.), the kneading time should not be too long and it is generally 1 to 5 minutes.

As a tentative criterion of this "mixture with substantially no crosslinking reaction", residual particles larger than 0.1 micron in diameter after 3-hour extraction of the mixture in boiling toluene (hereinafter referred to as "extraction residue") is in general not more than 15 wt %, preferably not more than 10 wt %, and most preferably not more than 5 wt % based on the weight of the mixture.

On producing this mixture, it is possible to add additives usually employed in the field of olefinic polymers, for example, stabilizers against oxygen, light (UV) and heat, metal deterioration inhibitors, flame retardants, electrical characteristics improvers, antistatic agents, lubricants, processability improvers, tackiness improvers, etc., in amounts which do not adversely influence the characteristics of the thin-wall body of this invention. Further, by adding a crosslinking accelerator such as epoxy compounds, p-toluenesulfonic acid, etc., the crosslinking of ethylenic copolymers (A) and (B) can be further fully completed. The amount thereof is generally at most 5.0 part by weight, preferably from 0.01 to 3.0 part by weight, per 100 parts by weight of these copolymers (4) Production of Thin-wall Body Where the thin-wall body of this invention is used in a film or sheet form, a thin-wall body may be obtained by an extruder widely employed when producing films by the T-die film inflation process generally used in the field of thermoplastic resins. Further, that made into a laminate may also be used. On such occasion, the extrusion temperature is not higher than 250° C. If the extrusion is effected at a temperature higher than 250° C. the copolymers (A) and (B) partially crosslink, generate fish eye; thus a uniform extruded product cannot be obtained. Therefore, the extrusion temperature, whether a crosslinking accelerator is incorporated or not, is within the temperature range similar to that for the above-described melt kneading.

The thus produced thin-wall body is rapidly cooled by a water-cooled roll or in a water tank in order to prevent adhesion of the thin-wall bodies to each other or between the thin-wall body and the take-off roll, whereby a thin-wall body having good transparency may be obtained. The thickness of the thin-wall body is from 0.2 $\mu$m to less than 5 mm, and preferably from 0.2 $\mu$m to 3.0 mm taking into consideration the flexibility and the insulating properties, and particularly preferably from 0.2 to 2.0 mm.

(5) Heating and Pressure-treating

Since the thin-wall body obtained as above is substantially not crosslinked, it exhibits the same behavior as the ordinary thin-wall body. In order to impart the thin-wall body with tne aforesaid heat resistance, the thin-wall body is subjected to heating and compression-treating at a temperature in the range of from 100° to 400° C. and a pressure of at least 5 kg/cm$^2$, preferably from 10 to 500 kg/cm$^2$ and more preferably from 15 to 200 kg/cm$^2$. By heating and compression-treating for from 20 to 30 minutes when the heating temperature is in the range of from 100° to 160° C., or for from 10 to 20 minutes when in the range of from 160° to 240° C., or for from 0.1 to 10 minutes when in the range of from 240° to 400° C., the crosslinking reactron (condensation reaction) takes place within the thin-wall body and the heat resistance is remarkably improved.

In other words, the mixture of copolymer (A) and copolymer (B) exhibits thermoplasticity at a temperature of not higher than 250° C., but it undergoes crosslinking by heating and compression-treating the mixture at 160° C. or higher, whereby a laminate having excellent heat resistance may be obtained.

By heating and compression-treating as classified above, the thin-wall body is crosslinked such that after the extraction of the crosslinked product with a boiled toluene for three hours the amount of the resulting residue having a size of 0.1 $\mu$m or more is at least 80% by weight, preferably not less than 85% by weight, more preferably 90% by weight or more, based on the weight of the crosslinked product.

In order to obtain printed circuit boards having excellent adhesion between the thin-wall body with the other layers (e.g., the electrically conductive metal layer), it is particularly preferred that the heating and compression-treating be carried out when laminating the uncrosslinked thin-wall body with the other constituent components (e.g., a metal foil or plate, a heat-resistant polymer, a thermosetting resin, etc.), as described hereinafter.

(6) Inorganic Filler

In this invention, the inorganic filler which can be incorporated in the mixture of copolymer (A) and copolymer (B) generally has a thermal conductivity of $1 \times 10^{-3}$ cal/°C.cm.sec or more and an electrical resistance value of $10^{10}$ $\Omega$ cm or more, and occupied from 5 to 70% of the total volume and preferably from 20 to 60% of the total volume. If the amount filled is less than 5% of the volume, improvement in the thermal conductivity is not manifested, whereas if it exceeds 70% by volume, although the thermal conductivity is improved, the bonding ability is lowered, and thus it is not preferred. While any inorganic filler can be used which has a thermal conductivity of $1 \times 10^{-3}$ cal/°C.·cm·sec or more and an electrical resistance value of $10^{10}$ $\Omega$ cm or more, representative examples thereof include beryllium oxide, boron nitride, magnesium oxide (magnesia), aluminum oxide (alumina), silicon carbide, and glass beads. The particle diameter of the powder of the inorganic filler is desirably not greater than 100 $\mu$m, and preferably is from 0.1 to 20 $\mu$m. If the particle diameter is less than 0.1 $\mu$m, it is difficult to uniformly disperse in the aforesaid mixture. On the other hand, if it exceeds 100 $\mu$m, the resulting layer A becomes too thick, and the bond strength is lowered, and thus such thickness is not desirable.

(7) Glass Fibers

The glass fiber which can be incorporated in the mixture of copolymer (A) and copolymer (B) generally have a fiber length of at least 0.5 mm, preferably from 1.0 to 50 mm, more preferably from 5 to 30 mm, and particularly preferably from 5 to 20 mm. If glass fibers having a fiber length of less than 0.5 mm are used, even if the amount of the glass fiber added is increased, the dimensional stability of the treated product obtained is poor, and moreover a printed circuit board having appropriate flexibility cannot be obtained. On the other hand, if a glass fiber having a fiber length of greater than 50 mm is used, it is difficult to uniformly disperse it, and thus processability is lowered. Further, a glass fiber treated with a silane compound, etc., may be preferably used.

The proportion of the glass fiber per 100 parts by weight of the total weight of copolymers (A) and (B) is at most 200 parts by weight, desirably from 5 to 150 parts by weight, and particularly preferably from 10 to 100 parts by weight. If the proportion of the glass is less than 5 parts by weight, the improvement in the dimensional stability is not sufficient. On the other hand, if it is incorporated in an amount of more than 200 parts by weight, the flexibility of the printed circuit board is lost, and when bent, it tends to remains bent and does not return to the original form.

Representative methods of mixing are described below.

A first method is to mix copolymer (A) and copolymer (B) beforehand, and then mix glass fiber into the obtained mixture.

A second method is to mix either copolymer (A) or copolymer (B) with glass fiber, and then mix the obtained mixture and the remaining mixing components.

A third method is to simultaneously mix all of the mixing components.

(8) Glass Cloth and Mat

The glass cloth and mat which can be used in this invention include those typically employed in the glass fiber industry, i.e., roving cloth, chopped strand mat, glass cloth, etc. The glass cloth includes plain weave, twill weave, designed weave, gauze weave, etc., of which the plain weave is preferred, and the density of the warp and weft is desirably from 10 to 20 lines/25 mm, preferably from 12 to 20 lines/25 mm, and more preferably from 15 to 18 lines/25 mm. In general, mats of 100 g/m² or less are used in 3- to 10-layered laminates, and in this invention, those obtained by laminating to a value of 20 g/m² or more are preferably used. Further, it is preferred to use those imparted with general stopping treatment, or further cleaning treatment or silane treatment for further improving the compatibility with the synthetic resin used.

The weight per square meter of the glass cloth or mat used in this invention is generally 20 g or more, preferably from 100 to 700 g, and particularly preferably from 200 to 700 g. If a glass cloth or mat of less than 20 g per square meter is used, dimensional stability of the thin-wall body obtained is lost, and hence peel-off from the conductive material, cracking, etc. are generated upon bending, and thus a weight per square meter of less than 20 g is not preferred.

(B) Electrically Conductive Metal Layer

Electrically conductive metal layers that can constitute the printed circuit board of this invention are roughly classified into a metal foil and a metal layer obtained by metal plating or metal deposition. Although the thickness varies depending on whether it is either of the above-mentioned, it is generally from 100 Å (10 nm) to 400 μm, preferably from 10 nm to 350 μm, and particularly preferably from 15 to 350 μm. Further, the electrical conductivity is generally from $10^{-7}$ to $2\times10^{-1}$ Ω, preferably from $10^{-7}$ to $1\times10^{-1}$ Ω, and particularly preferably from $2\times10^{-7}$ to $1\times10^{-1}$ Ω.

(1) Metal Foil

The thickness of the metal foil used in this invention is generally from 1 to 400 μm, preferably from 3 to 100 μm, and particularly preferably from 5 to 50 μm. As the metal for the metal foil, electrically conductive metals, such as copper, aluminum, and alloys mainly comprising these metals are preferred, and in particular, an electrolytic copper foil of from 15 to 40 μm in thickness is particularly preferably used.

(2) Electroless Plating

As electroless plating, i.e., chemical plating, nickel plating, highly corrosion-resistant zinc-nickel alloy plating, copper plating, etc., are generally known and can be used herein, but for a printed circuit board, copper sulfate plating is usually practiced, because it can provide a uniformly thick and dense plating on the entire surface contacted with the treating solution and it gives particularly excellent adherence and ductility between the material (board) and the plating. By such copper sulfate plating, the crystals are minute, and leveling (uniform thickness) is imparted, and at the same time stabilized processability and excellent physical characteristics may be obtained.

In general, the copper sulfate plating is effected by supplying metal copper to the solution and using copper sulfate and sulfuric acid in order to enhance the electrical conductivity and uniform electrodepositing properties of the solution. Further, chlorine ions (as a catalyst) and an appropriate amount of a brightener are used. Furthermore, in order to promote leveling, a polyoxyethylene or polyoxypropylene derivative is sometimes used. A representative composition contains from 5 to 40 g of copper sulfate ($CuSO_4.5H_2O$) in one liter of an aqueous solution, using sodium hydroxide (NaOH), ammonium chloride ($NH_4Cl$), etc., as a pH adjusting agent (buffer), disodium ethylenediaminetetraacetate (EDTA-2Na) for preventing abnormal deposition of the copper in the aqueous solution, and formaldehyde (HCHO) as a reducing agent. In addition, it is also possible to effect surface protection or corrosion prevention by providing electroplating of copper, nickel, gold, etc., on the conductive surface (conduit) of these chemical (electroless) platings or to mount soldering on the conductive conduit through a soldering bath.

(3) Deposition

As the method of depositing a metal, generally employed vacuum heating deposition such as resistance heating, electronic radiation heating, induction heating, heat radiation heating, etc., or sputtering may be used. As the metal depositing material, such metals as aluminum, gold, copper, nickel, platinum, etc., and alloys mainly comprising these (50% by weight or more) may be used. Especially, for a minute circuit, copper, platinum and gold are often used, and where a circuit is formed by etching after forming a thin film, copper and aluminum and an alloy mainly comprising these are preferably used.

While the thickness of the conductor thin film deposited may be freely selected depending on the conditions of the device used, it is generally from 100 Å to 100 μm, and particularly desirably is from 1000 Å to 20 μm.

Further, it is also possible to effect surface protection or corrosion prevention by providing electroplating of copper, nickel, gold, etc., on the conductive surface or to mount soldering on the conductive surface through a soldering bath.

The circuit may be formed on the surface and inner surface of through holes of the thin-wall body (or the thin-wall body laminated with other materials described later) according to the so-called "fully-additive process" utilizing the vacuum vapor deposition technique. Generally speaking, an insulation material used in the fully-additive process is one which has an adhesive coated on the surface, but the thin-wall body of this invention shows excellent adhesion to the vacuum vapor deposited film even without the use of an adhesive, and a printed circuit board can be easily obtained. For example, the thin-wall body is cut into lengths of predetermined dimension and holes are bored by either punching, drilling, or pressing. Then, a negative pattern with respect to circuit is formed by screen printing or non-circuit portion is masked with a photosensitive material, and vacuum vapor deposition is carried out on the masked thin-wall body so that vacuum vapor deposited metal film of a prescribed thickness can be formed on the unmasked circuit portion.

In the fully-additive process, a layer which functions not only as a photosensitive material but also as an adhesive is generally formed, and by exposing to light this layer, only the circuit portion is made adhesive and readily capable of forming a deposition film thereon. In the printed circuit board of this invention, however, such a layer is not needed, and the vacuum vapor deposited metal film may be formed directly on the surface of the thin-wall body with good adhesion, so that it is not only adapted for mass production system, but also free from defects in the ordinary etching (e.g., pattern break) and a precise circuit can be formed with ease. After the vacuum vapor deposition, gold, tin, solder, etc. can also be plated for the purpose of protection and anticorrosion of the circuit and further molding IC chip.

The printed circuit board of this invention can be obtained by any of adhesive printing process, adhesive photograph process and direct process that are practical in the fully-additive process.

The fully-additive process may also be carried out in this invention utilizing the electroless plating technique wherein the circuit is formed by electroless plating the surface and inner surface of through holes of the above described thin-wall body, wherein an etching step as in the case of metal foil laminated plate is not needed.

(C) Other Layer

While the printed board according to this invention can be comprised of two layers, i.e., layer A and layer B, in order to further improve the electrical insulating properties, dimensional stability, heat resistance, chemical resistance, flexibility, and moisture resistance of the printed circuit board obtained, it is also possible to laminate layer A and layer B with a thermosetting resin layer (hereinafter referred to as "layer C"), a heat-resistant thermoplastic resin layer (hereinafter referred to as "layer D"), and a metal layer (hereinafter referred to as "layer E"), via layer A, or it is also possible to laminate layer A and layer B with layer C, layer D and layer E via layer A and a glass cloth or mat (hereinafter referred to as "layer F"). Alternatively, layer B and layer E may be laminated via layer A, or layer A and layer F, using the layer C or the layer D as an intermediate layer. Further an aramid fiber sheet or a ceramic sheet (hereinafter referred to as "layer G" and "layer H", respectively) may be laminated on layer B via layer A.

(1) Sheet of Aramid Fibers

Aramid fibers constituting the other layer of the present invention are fibers of polyamides generally having aromatic molecular skeletons (hereinafter referred to as aromatic polyamides), which are distinguished from usual aliphatic polyamide fibers, i.e., nylon.

The aromatic polyamides are classified into aromatic polyamide (I) having a linear para-bonding molecular skeleton represented by formula (IV); aromatic polyamide (II) having a zigzag para-bonding molecular skeleton represented by formula (V); and aromatic polyamide (III) having a zigzag meta-bonding molecular skeleton represented by formula (VI):

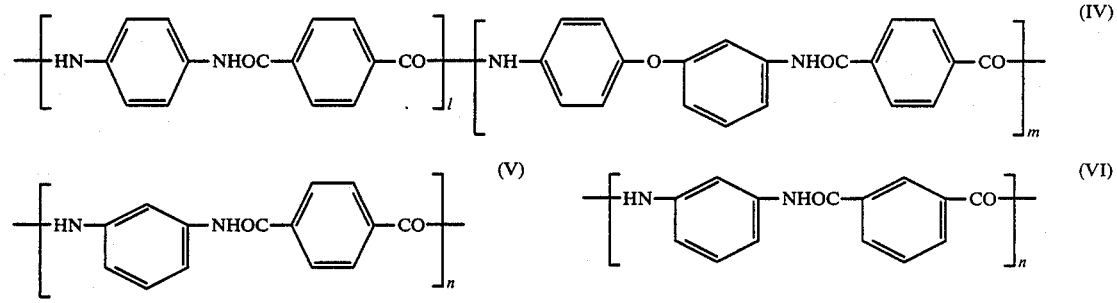

wherein l+m and n each is from 50 to 3000 and preferably from 50 to 2000, and l/m is from 0.2/1 to 5/1, preferably 0.3/1 to 3/1 and more preferably 0.5/1 to 2/1.

Aromatic polyamides (II) and (III) can be spun by a wet process because of their high solubility in solvents. On the other hand, aromatic polyamide (I) having a low solvent-solubility can be spun into fibers having high strength and high modulus of elasticity by spinning its dope in fuming sulfuric acid, and stretching the filaments at a high temperature.

Therefore, these aromatic polyamides can be formed into multifilaments usually having a fineness of from 1 to 3 denier and a cross section having a diameter of from 10 to 20 $\mu$m. The multifilaments alone may be formed into nonwoven sheet. The multifilaments may be cut to lengths of from 3 to 15 mm or pulped by a centrifugal spinning process or a blow-off process so as to have a fibrous surface, each fiber having a thickness of 1 $\mu$m or less and a length of from 2 to 5 mm, and the resulting cut fibers or pulp-like material, either alone or in combinations thereof, are matted in a wet or dry process to obtain paper sheets. Further, filament yarns alone or union yarns obtained by spinning a blend of the cut fibers or the pulp-like material by a usual spinning process can be woven into fabric. The details for the above-described aramid fibers are described in Sakai, et al., *Plastics*, Vol. 36, No. 3, pp. 20–45 (1985).

The sheet materials which can be used in the present invention may be any of those prepared from the above-described materials. A laminate composed of a plurality of sheets may also be employed.

The sheet to be used has a weight of at least 10 g per $m^2$, preferably from 10 to 500 g/$m^2$, and more preferably from 20 to 500 g/$m^2$. Sheets having less weights are too low in strength to be produced stably. On the other hand, if the sheet has a weight exceeding 500 g/$m^2$, ethylenic copolymer (A) or ethylenic copolymer (B) as described above, or a mixture thereof cannot sufficiently be impregnated into such a sheet, failing to obtain a high-strength printed circuit board.

Tne woven fabric to be used as the sheet preferably has a high density so as to make the surface roughness of the printed circuit board as small as possible. In the nonwoven fabric or paper sheets, the smaller the size of the fibers, the better from the similar reasons. The size of the fibers is generally not more than 10 $\mu$m, and desirably not more than 1 $\mu$m.

(2) Sheets of Glass Fibers

Glass fabric or sheet which can be used in the present invention includes roving cloth, chopped strand mat and glass cloth that are commonly employed in the field of glass fiber. Glass fabric includes plain weave fabric, twill fabric, satin weave fabric, patterned fabric, leno weave fabric, etc., with plain weave fabric being preferred. The density of the fabric in the warp and weft is from 10 to 20 ends per 25 mm, preferably from 12 to 20 ends per 25 mm, and more preferably from 15 to 18 ends per 25 mm. These conditions are specified as "glass cloth" in JIS R3414. It is preferable to use glass fabric having been subjected to general sealing treatment. Further, in order to improve compatibility with synthetic resins to be used, the glass fabric is preferably subjected to cleaning treatment or treatment with silane coupling agents.

(3) Ceramic Sheet

Ceramic sheets which can be used in the present invention can be prepared by a process comprising sintering a ceramic material into a plate form and a process of forming a thin film of a ceramic material on a plate, e.g., a metal plate.

Processes for forming a ceramic thin film include a chemical vapor deposition process (CVD process) utilizing a chemical reaction, and a vacuum deposition process, a sputtering process or a spray coating process, the latter three processes utilizing a physical means. The vacuum deposition process comprises depositing a ceramic material under a high degree of vacuum, usually below $10^{-5}$ Torr, by resistance heating, high frequency heating, electron bombardment, laser heating, or the like. The spray coating can be carried out by a commonly employed technique, in which a ceramic material having a high melting point is fused by a high temperature source, e.g., plasma, and, at the same time, spray-coated at a high speed onto the surface of a plate to be coated. In the case of plasma spraying, for instance, an ultra-high temperature of about 1,500° C. can be obtained by using argon, helium, hydrogen, nitrogen, etc. as a plasma-generating gas. Other spray coating techniques include flame spraying using acetylene-oxygen flame, arc spraying, and the like, in which ceramic particles can be sprayed at a high speed around sound velocity to form a dense ceramic film on a plate, e.g., a metal plate. It is possible to reach a high temperature of about 2,400° C. by the flame spraying or about 5,000° C. by the arc spraying. Of these spraying techniques, the plasma spraying is preferred since the plasma flame is neutral flame having a weak oxidative or reducing effect so that the ceramic material to be sprayed is less susceptible to denaturation by oxidation or reduction. In carrying out this process, spray guns of from low to high energy, i.e., of from 10 KW to 200 KW, can be used depending on the size or shape of the material to be coated.

According to the sintering process, various sintered products can be obtained depending on the particle size, particle size distribution, state of cohesion and impurities of the starting ceramic material, as well as sintering conditions, such as molding method, sintering temperature, sintering time, sintering atmosphere, etc. The sintering is effected by reactive sintering, pressure sintering (HP process or HIP process), pressure-free sintering, gas pressure sintering, and the like. In recent years, injection molding has been widely adopted for the purpose of mass-production. This process comprises, in general, mixing ceramic powders with an organic binder, primarily molding the mixture by an injection molding machine, degreasing the primary molded product, and subjecting the product to sintering to obtain a final product. The above-described sintering process and film forming process are widely known and industrially carried out.

Examples of ceramic materials to be employed include alumina ($Al_2O_3$), silicon nitride ($Si_3N_4$), silica ($SiO_2$), titanium nitride (TiN), titanium carbide (TiC), zirconia ($ZrO_2$), mullite porcelain ($Al_2O_3$-$SiO_2$ system), $ZrO_2$.$SiO_2$, beryllium oxide (BeO), magnesia (MgO), $BaTiO_3$, $SiTiO_3$, boron nitride (BN) and boron carbide ($B_4C$). Of these, alumina and silicon nitride are preferred. In particular, alumina can be used to advantage because of excellence in heat resistance, thermal conductivity, mechanical strength, impact strength, electrical insulating property and chemical durability as well as relative inexpensiveness and good processability.

The thickness of the ceramic layer varies depending upon whether it is produced by film formation or sintering. More specifically, the thickness usually ranges from 100 Å to 0.1 mm, and preferably from 1 to 100 $\mu$m in case of the film forming process, and it usually ranges from 50 $\mu$m to 10 mm, and preferably from 0.1 to 1.5 mm in case of the sintering process.

(4) Thermosetting Resin Layer and Heat-resistant Thermoplastic Resin Layer

The thermosetting resin layer and heat-resistant thermoplastic resin layer constituting the printed circuit board of this invention are those obtained from the following thermosetting resins, polyimides, polyesters, and other heat resistant polymers.

(a) Thermosetting Resin Layer

The thermosetting resin layer according to this invention may be a laminate of a thermosetting resin or a laminate impregnated with a thermosetting resin. As the thermosetting resin, a phenolic resin, an epoxy resin, and an unsaturated polyester resin may be used. These thermosetting resins are well known, as described in, for example, *Encyclopedia of Polymer Science and Technology*, Vol. 10 pp. 1-72, Vol. 6 pp. 209-270 and Vol. 11 pp. 129-168. The thickness of the layer is generally 0.6 to 4.0 mm, and preferably from 0.8 to 3.2 mm. It is also possible to laminate glass fiber such as glass fiber, staple fiber, etc., weighing from 20 to 200 g/m$^2$ and having a thickness of 30-200 $\mu$m, or to laminate fibrous materials such as an organic fiber, carbon fiber, etc., impregnated with a thermosetting resin. In addition, these fibrous materials may be used together with pulp by making into paper by a wet paper making process similar to the ordinary paper making process. Further, in order to enhance the electrical characteristics of the glass paper, it is also possible to use that treated with an epoxy resin, an alkyd resin, an ethylene-vinyl acetate copolymer, etc., or by the so-called silane treatment, for improving the impregnation of the aforesaid thermosetting resin. Representative examples include glass cloth-based epoxy resin laminates for copper lining, etc., specifically those expressed as GE2, GE2F, GE4, and GE4F by JIS designation, paper-based phenolic resin laminates for copper lining, paper-based epoxy resin laminates for copper lining, etc.

(b) Heat-Resistant Thermoplastic Resin Layer

The heat-resistant thermoplastic resin layer used in this invention include a polyimide film, a polyester film, and the like, which have a glass transition temperature of 100° to 400° C. The thickness of the layer is generally 20 $\mu$m to 2.0 mm, preferably from 50 $\mu$m to 1.6 mm, and particularly preferably from 100 $\mu$m to 1.6 mm.

The polyimide film is generally obtained by casting a polyimide acid solution prepared by a low temperature solution polymerization process, drying and further subjecting to a dehydration ring-formation reaction. Further according to this invention, a polyamideimide having an amide group in the polymer backbone of the aforesaid polyimide may also be preferably employed. The general formula of the polyimide is shown by the following formula (VII), and that of the polyamideimide by formula (VIII). These polymers are described in detail in *Encyclopedia of Polymer Science and Technology*, Vol. 11 pp. 247–272 and U.S. Pat. No. 4,377,652.

(VII)

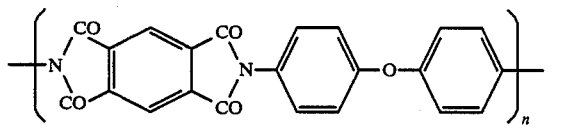

(VIII)

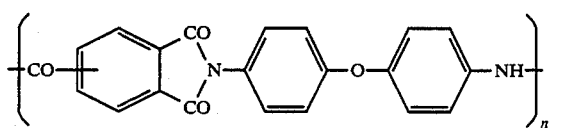

wherein n is 5 to 200.

Polyester film may also be used as the heat-resistant thermoplastic resin layer. The polyester is a polymer compound containing an ester bond

in the constituent molecular chain and having an aromatic ring in the chain unit of the polymer. This is a polymer or copolymer obtained by the condensation reaction of an aromatic dicarboxylic acid or an ester-forming derivative thereof (which may be replaced by up to 40 molar % of an aliphatic dicarboxylic acid or an alicyclic dicarboxylic acid) and an aliphatic diol having from 2 to 20 carbon atoms or an ester-forming derivative thereof (which may be replaced by up to 50 molar % of a long-chain glycol having a molecular weight of from 400 to 6,000). This polyester has an intrinsic viscosity in the range of from 0.4 to 1.5, and preferably from 0.4 to 1.3, as measured at 30° C. in a 1/1 (ratio by weight) mixed solvent of phenol and tetrachloroethane. Representative polyesters are polyalkylene terephthalate resins, which are widely used, such as polyethylene terephthalate, polypropylene terephthalate, and polybutylene terephthalate. These polyesters are described in *Encyclopedia of Polymer Science and Technology*, Vol. 11, pp. 42–120.

As this polyester film, Mylar by E. I. Du Pont (U.S.A.), Lumilar by Toray (Japan), Q Film by Teijin (Japan), etc., are well known.

Heat resistant polymers having a glass transition temperature (hereinafter referred to as "Tg") of from 100° to 400° C. may also be used in the invention and they include those having the following polymer backbones: Examples of those having an amide bond as the skelton structure include: poly-m-xyleneadipoamide which is a polycondensate of xylenediamine and adipic acid

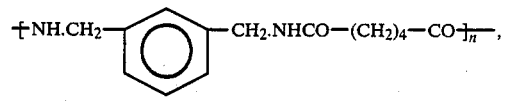

poly-p-benzamide (Tg 230° C. or higher)

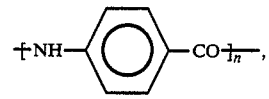

poly-p-phenylene terephthalamide (Tg 345° C.)

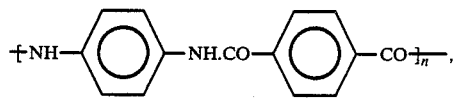

poly-m-phenylene isophthalamide (Tg 230° C. or higher)

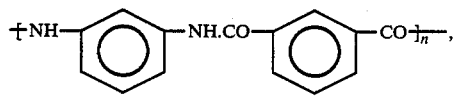

etc. Examples of those having an ester bond as the skelton structure include polyacrylate obtained by the polycondensation of bisphenol A and isoterephthalic acid chloride

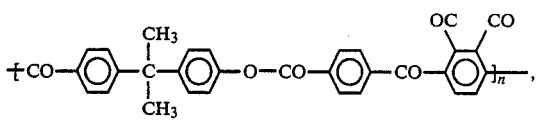

polyoxybenzoate copolymer of a condensate of p-hydroxybenzoic acid

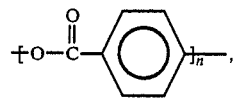

aromatic polyester carbonate which is a condensate of bisphenol A, phosgene and isoterephthalic acid chloride

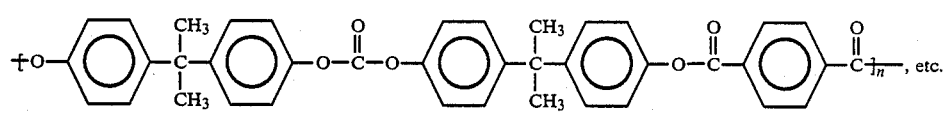

Examples of those having an ether bond as the skelton structure include polyoxymethylene

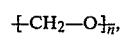

polyphenylene oxide

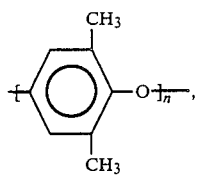

polyether sulfone

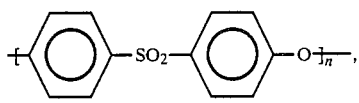

polysulfone

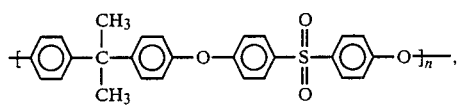

polyether ether ketone

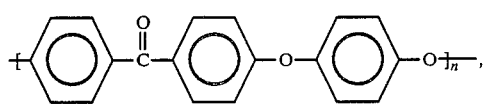

polyphenylene sulfide

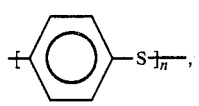

etc. Other examples include polytriazines

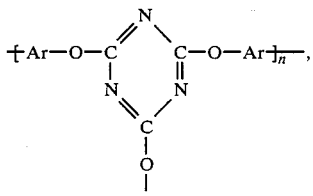

(Tg 240°–330° C.), polyparabanic acid

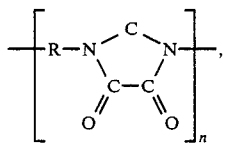

polyhydantoin, polyazomethine, polydistyrylpyradine, etc.

(5) Other Constituent Components

As the other constituent components, the following metal plate or foil be used for layer F.

(a) Metal Plate

The metal plate used in this invention is that which may be bend and draw processed and also has a function of dissipating heat, and that having a thickness of from 0.1 to 3 mm is preferred; more preferably the thickness is from 0.1 to 2.5 mm. As the metal material, metals such as aluminum, copper, iron, etc., and alloys mainly comprising these metals (e.g., stainless steel) may be used. Using a metal plate such as an iron plate, a copper plate, etc., and also utilizing the magnetic effect, the products are apparently useful for motor magnetic circuits, communication circuit switches, electronic switching systems, heat dissipation plates, etc.

(b) Metal Foil, Glass Cloth and Mat

The metal foil, glass cloth and mat used for layer E are the same as those described in the earlier portion of the specification, except that the thickness of the metal foil layer is generally 5 to 200 μm, preferably 5 to 100 μm and more preferably 10 to 70 μm and that the weight of the glass cloth or mat is generally not more than 300 g/m$^2$, preferably 50 to 250 g/m$^2$ and more preferably 50 to 200 g/m$^2$.

(D) Process for the Production of Printed Circuit Boards

The process for the production of printed circuit boards by this invention may be roughly classified into the following process if an electrically conductive metal foil or plate is used as the electrically conductive metal layer (layer B) (i.e. the production is effected without metal plating or metal deposition).

A first process comprises inserting the thin-wall body of the substantially uncrosslinked mixture produced as described above between the aforesaid electrically conductive metal foils or plates per se or between the electrically conductive metal foil or plate and the auxiliary layer C, D, E, F, G, or H (which may be used singly or as two or more layers) and subsequently heating and compression-treating at a temperature and a pressure in the ranges described hereinabove. On that occasion, where air, etc., is involved between the thin-wall body of the mixture and the auxiliary layer (sometimes not used) or between the electrically conductive metal foil or plate and the thin-wall body of the mixture, it is necessary to conduct heat contact bonding using a hot press, a hot roll, etc. Although adequate adhesion may be obtained at a heating temperature of 380° C. or below, where heat resistance is required, it is preferred to effect contact bonding at as high temperature as possible (generally from 200° to 300° C.). By heating and contact bonding at a temperature from 10° to 20° C. higher than the required heat resistant temperature, a laminate having excellent heat resistance and adhesion may be obtained.

A second process comprises applying a process generally employed for the production of multilayered laminates.

That is, the thin-wall body of the mixture obtained above is provisionally bonded uniformly to the electrically conductive metal foil with or without the auxiliary layer(s) at a temperature of 120° to 250° C. and subsequently heated and pressure-treated at a temperature of 250° C. or higher. In this process, it is shown that a multilayer formation is possible by provisionally bonding one layer upon another to laminate all the layers, and finally heating and pressure-treating the laminate.

For producing layer B, i.e., the electrically conductive metal layer, of the printed board of this invention by the electroless plating (i.e., by chemical plating) or deposition, layer A or a laminate composed of layer A and the auxiliary layers, C, D, E, F, G and/or H is prepared, and an electrically conductive metal is chemically plated or deposited thereon as described above.

Furthermore, for forming layer E, i.e., the metal layer, by electroless plating or deposition, procedures similar to those described above may be conducted.

(E) Bending, Drawing and Circuit Forming Methods

Representative methods for providing the thus obtained printed board with bending or drawing are described below.

In general, it is preferred to etch the copper foil to form a circuit and thereafter provide bending or drawing, but it is also possible to provide such processing before etching if the copper foil, etc., does not come off during the subsequent etching step.

For bending, for example, generally practiced V bending, U bending, end bending, corrugation, elongation bending, etc. may be practiced, and the board laid on a die is processed using a punch. On this occasion, it is necessary to use a soft material as the punch because the punch slides on the board surface and otherwise sometimes leaves scratches.

For drawing, cylindrical drawing, square cylindrical drawing, and double drawing may be practiced, and since the part where the central part is pressed by the punch and accordingly the flange part is compressed in the cylindrical direction and also contacted locally with the tensile die in the radius direction receives forces such as bending, reverse bending, etc., it is important, when deep drawing, to conduct processing or design the circuit so that the circuit section is not subjected to such forces by taking the circuit pattern into consideration. Conventional aluminum bending and drawing may be conducted.

Printed circuit boards according to this invention are described by referring to the accompanying drawings.

FIG. 1 is an enlarged cross-sectional view of a part of a printed circuit board which comprises an electrically conductive metal layer 1 (corresponding to layer B) and a crosslinked thin-way body of copolymer (A) and copolymer (B) (hereinafter referred to as an "E-E resin").

Figure 2:
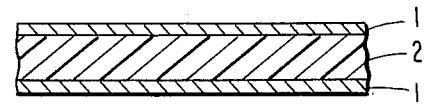

FIG. 2 is an enlarged cross-sectional view of a part of a representative example of a double-sided metal-clad printed circuit board of a structure of the printed circuit board of FIG. 1 further provided with an electrically conductive metal foil 1 on the other surface of the crosslinked thin-way body 2.

Figure 3:
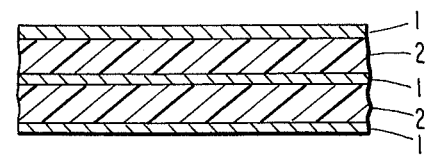

FIG. 3 is an enlarged cross-sectional view of a part of a representative example of a multilayered printed circuit board of the structure of a laminate of single-sided and double-sided metal-clad printed circuit boards as illustrated in FIG. 1 and FIG. 2.

Figure 4:
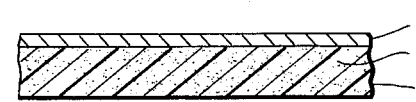

FIG. 4 is an enlarged cross-sectional view of a part of a representative example of a printed circuit board which comprises an electrically conductive metal layer 1 and an E-E resin 2 containing an inorganic filler 3.

Figure 5:
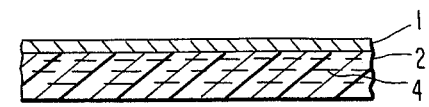

FIG. 5 is an enlarged cross-sectional view or a part of a representative example of a printed circuit board which comprises an electrically conductive metal layer 1 and an E-E resin 2 containing glass fibers 4.

Figure 6:
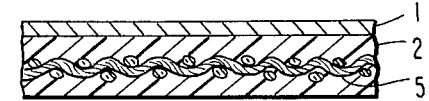

FIG. 6 is an enlarged cross-sectional view of a part of a representative example of a printed circuit board which comprises an electrically conductive metal foil 1 and an E-E resin 2 containing glass cloth 5.

Figure 7:
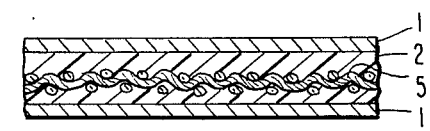

FIG. 7 is an enlarged cross-sectional view of a part of a representative example of a double-sided metal-clad printed circuit board of the structure of the printed circuit board of FIG. 6 further provided with an electrically conductive metal foil 1 on the other surface.

Figure 8:
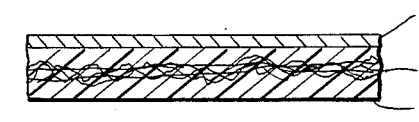

FIG. 8 is an enlarged cross-sectional view of a part of a representative example of a printed circuit board which comprises an electrically conductive metal foil 1 and a E-E resin 2 containing an aramid nonwoven sheet 6.

Figure 9:
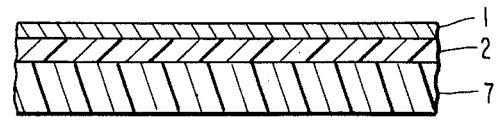

FIG. 9 is an enlarged cross-sectional view of a part of a representative example of a printed circuit board of a structure obtained by bonding an E-E resin 2 between an electrically conductive metal foil 1 and a thermosetting resin plate 7 by heating and contact bonding.

Figure 10:
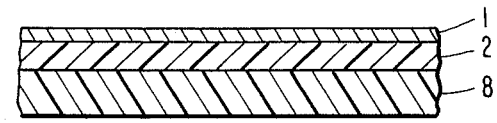

FIG. 10 is an enlarged cross-sectional view of a part of a representative example of a printed circuit board of a structure obtained by bonding an E-E resin 2 between an electrically conductive metal foil 1 and a heat-resistant thermoplastic resin plate 8 by heating and contact bonding.

Figure 11:
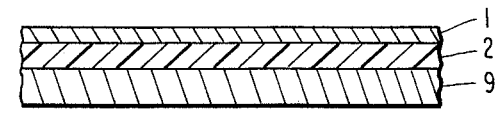

FIG. 11 is an enlarged cross-sectional view of a part of a representative example of a printed circuit board of a structure obtained by bonding an E-E resin 2 between an electrically conductive metal foil 1 and a metal foil or metal plate 9 by heating and contact bonding.

Figure 12:
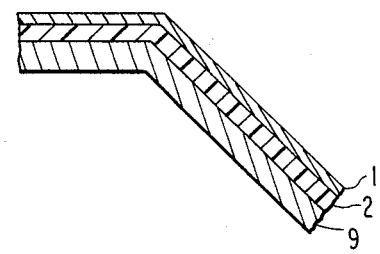

FIG. 12 is an enlarged cross-sectional view of a part of a representative example of a printed circuit board obtained by bending the printed circuit board of FIG. 11.

Figure 13:
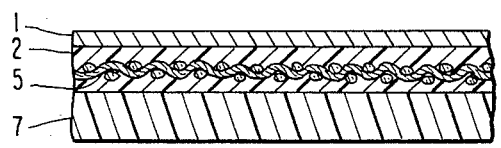

FIG. 13 is an enlarged cross-sectional view of a part of a representative example of a printed circuit board of a structure obtained by bonding an E-E resin 2 containing a glass cloth 5 between an electrically conductive metal foil 1 and a thermosetting resin plate 7 by heating and contact bonding.

Figure 14:
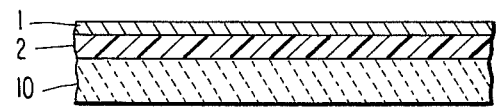

FIG. 14 is an enlarged cross-sectional view of a part of a representative example of a modification of the printed circuit board of FIG. 9, wherein the thermosetting resin plate is replaced by a ceramic film 10.

Figure 15:
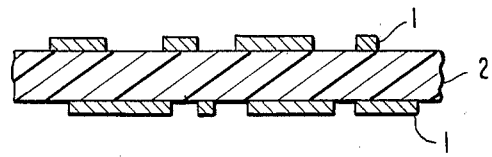
FIG. 15 is a cross-sectional view of the double-sided copper-pattern printed circuit board of FIG. 2 etched to form a circuit.

FIG. 15 is an enlarged cross-sectional view of a part of a representative example of the double-sided copper-pattern printed circuit board of FIG. 2, particularly illustrating etching to form a circuit such as by conventional copper etching treatment.

Figure 16A:
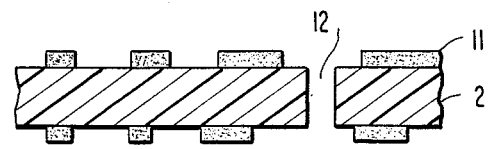
FIG. 16 (a), 16 (b), and 16 (c) are schematic views illustrating a procedure for forming a circuit on a double-sided through hole board according to this invention.
Figure 16B:
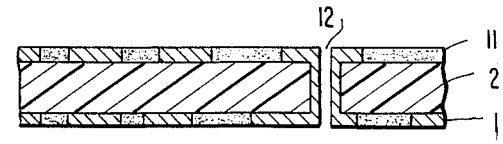
Figure 16C:
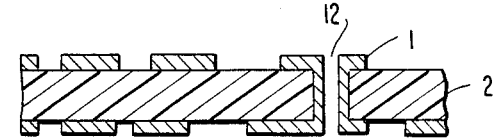

FIGS. 16 (a), (b) and (c) are schematic cross-sectional views, illustrating steps in a procedure for forming a circuit on a double-sided through hole board, wherein (a) shows the state wherein the parts other than that intended for the circuit formation have been masked with a masking agent 11, (b) shows the state where both surfaces have been covered with an electrically conductive metal, e.g., by electroless copper plating, deposition sputtering, etc., and (c) shows the state where the mask has been removed, whereby the circuit having a through hole part 12 is formed.

Figure 17:
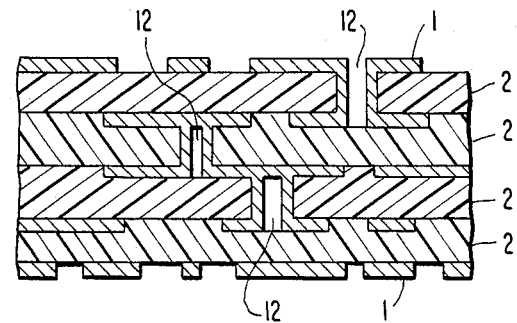
FIG. 17 is a cross-sectional view of a representative example of a multilayered printed circuit board of this invention.

FIG. 17 is an enlarged cross-sectional view of a part of a represented example of a multilayered printed circuit board produced by the above procedure.

In accordance with this invention, since it is not necessary to further employ an adhesive conventionally used between the electrically conductive metal foil (layer B) and the E-E resin layer (layer A) or between such a metal foil and the layer C, D, E, F, G or H, not only is the step of coating an adhesive eliminated, but also blisters due to volatile matters (e.g., organic solvents) contained in the adhesive are not generated during heating. Further, on forming a thin-wall body and on heating and contact bonding, the insulating adhesive resin layer exhibiting thermoplasticity is crosslinked by the high temperature and compression treatment and becomes a crosslinked thin-wall body, and therefore it is advantageous in that it has flexibility, extremely improved heat resistance, etc.

Further, with the E-E resin used in this invention, since the bond strength of the non-electroless copper layer by the through hole plating is excellent, a precise pattern may be obtained as compared with conventional copper-pattern boards of, e.g., glass-epoxy resin type, paper-phenolic resin type, polyimide film, polyester film, etc., and even when mass-production is conducted, products of stabilized quality may be obtained. In addition, since the E-E resin is flexible, no whiskers are generated and the thickness and precrsion of the plating may be uniformly established. Furthermore, in the field requiring no flexibility, by laminating an ordinary glass base cloth as an intermediate layer, a method for improving the hardness of the dimensional change may also be applied. These methods do not substantially lower the adherence of the electroless plating of this invention.

As described above, the printed circuit boards obtained according to this invention not only have good heat resistance, but also have remarkably improved reliability of electrically insulating properties, and moreover have crosslinking ability and adhesion on compression-treating at high temperatures, which have been invented based on an idea completely different from the concept in the conventional heat resistant polymer industry.

Having now generally described the invention, a further understanding can be attained by reference to certain specific Examples, which are provided herein for purposes of illustration only, and are not intended to be limiting in any manner.

In the Examples and Comparative Examples the test for heat resistance was conducted by floating the film obtained in a copper-pattern printed board having a test pattern shown in UL 796 (Printed Circuit Boards) FIG. 7.1 in a soldering bath of lead/tin=90/10 (weight ratio) maintained at 300° C. for 3 minutes. The evaluation is expressed as follows:

A: Kept the original form, showing no change.

B: Although no change is observed in appearance, the peeling strength of the copper layer was reduced to the half.

X: Changes such as peel-off, cracking, breaking, separation, etc., were observed between the base insulating material and the adjacent layer and/or within the copper circuit.

In the Examples and Comparative Examples, as described hereinbelow, the following mixtures of ethylenic copolymers (A) and (B) were used:

a mixture of an ethylene/acrylic acid copolymer whose M.I. was 300 g/10 min. (density: 0.954 g/cm$^3$; acrylic acid copolymerization ratio: 20 wt %; hereinafter referred to as "EAA") and an ethylene/methyl methacrylate/glycidyl methacrylate terpolymer (methyl methacrylate copolymerization ratio: 18.6 wt %; glycidyl methacrylate copolymerization ratio: 12.7 wt %; hereinafter referred to as "GMA") (mixture ratio: 1/1 (weight ratio); hereinafter referred to as "Mixture (A)";

a mixture of an ethylene/methacrylic acid copolymer whose M.I. was 200 g/10 min. (density: 0.950 g/cm$_3$; methacrylic acid copolymerization ratio: 25 wt %) and the above GMA (mixture ratio: 1/1 (weight ratio); hereinafter referred to as "Mixture (B)");

a mixture of an ethylene/methyl methacrylate/maleic anhydride terpolymer whose M.I. was 105 g/10 min. (methyl methacrylate copolymerization ratio: 20.5 wt %); maleic anhydride copolymerization ratio: 3.1 wt %) and the above GMA (mixture ratio: 3/7 (weight ratio); hereinafter referred to as "Mixture (C)"); and a mixture of the above EAA and a saponified product (degree of saponification: 97.5%; M.I.: 75 g/10 min; density: 0.951 g/cm$^3$) of an ethylene/vinyl acetate copolymer (vinyl acetate copolymerization ratio: 28 wt %) (mixing ratio: 1/1 (weight ratio); hereinafter referred to as "Mixture (D)").

These mixtures were all prepared by dry blending for 5 minutes by means of a Henschel mixer.

EXAMPLES 1-4 AND COMPARATIVE EXAMPLES 1-5

Sheets of 1 mm in thickness were formed using Mixtures (A)–(D), EAA or GMA with an extruder equipped with a T-die (diameter 40 mm, die width 30 cm, rotation 85 rpm) under the temperature conditions set forth in Table 1 and taken by a water-cooled roll at 20° C. The obtained respective sheets were laminated with electrolytic copper foils (35 μm in thickness) using a hot press at 300° C. for 10 minutes at 20 kg/cm$^2$ (gauge pressure) as shown in FIG. 1, and printed circuit boards were produced using the laminates, respectively. The properties of the obtained respective sheets (laminates) and the results of the heat resistance test are set forth in Table 1. Further, the crosslinking degrees of the sheet (thin-wall body) before and after the lamination (i.e., before and after the heating and compression-treating were measured in terms of amounts of residue having a size of 0.1 μm or more when extracted in a boiled toluene for three hours, and the results are also set forth in Table 1.

With the boards obtained in Examples 1 to 4, the conductor circuits of the copper foils did not show disconnection, loosening, or detachment from the sheet. In Comparative Examples 1 to 3, since the adhesion with the copper foil was poor, it was impossible to produce the printed circuit boards for the heat resistance test. Further, in Comparative Examples 4 and 5, the conductor circuits became detached in the heat resistance test.

Further, the peel strengths of the printed circuit boards as prepared in Example 1 and Comparative Example 1 were measured ten times by peeling the mixture (A) or (D) layer from the copper foil at a peel angle of 180° C. and a peeling rate of 50 mm/min. As a result, the peel strength of the board of Example 1 was within 3.1 to 3.6 kg/cm, whereas the peel strength of the board of Comparative Example 1 varied from 1.5 to 3.5 kg/cm.

TABLE 1

| Example or Comparative Example No. | Kind of Mixture, Etc. | Cylinder Temperature $C_1$ (°C.) | Cylinder Temperature $C_2$ (°C.) | Die Temperature D (°C.) | Properties of Sheet after Lamination | Heat Resistance Test 300° C., 3 Min | Crosslinking Degree of Sheet Before Lamination (wt %) | Crosslinking Degree of Sheet After Lamination (wt %) |
|---|---|---|---|---|---|---|---|---|
| Example 1 | Mixture (A) | 120 | 140 | 140 | Good film without gels or foaming | A | 0.2 | 96.0 |
| Example 2 | Mixture (A) | 120 | 140 | 160 | Good film without gels or foaming | A | 0.4 | 97.0 |
| Example 3 | Mixture (B) | 120 | 160 | 200 | Good film without gels or foaming | A | 0.8 | 97.5 |
| Example 4 | Mixture (C) | 120 | 140 | 160 | Good film without gels or foaming | A | 0.5 | 96.0 |
| Comparative Example 1 | Mixture (D) | 120 | 160 | 240 | Small bubbles partly observed | B | 81 | * |
| Comparative Example 2 | Mixture (D) | 120 | 240 | 300 | Gels and foams generated | * | 87 | * |
| Comparative Example 3 | Mixture (D) | 120 | 240 | 330 | Gels abundantly formed, molding difficult | * | 93 | * |
| Comparative Example 4 | EAA | 120 | 140 | 140 | Good film | X | — | — |
| Comparative Example 5 | GMA | 120 | 140 | 140 | Good film | X | — | — |

*Not measured because printed circuit boards could not be obtained.

EXAMPLES 5–9 AND COMPARATIVE EXAMPLES 6–8

The inorganic powders (inorganic fillers) set forth in Table 2 were mixed into the aforesaid Mixtures (A)–(C), EAA or GMA by dry blending using a Henschel mixer for 5 minutes and thereafter extruded using conditions similar to those in Example 3 to produce sheets (1.0 mm in thickness).

The inorganic fillers used herein were boron nitride (thermal conductivity 35 Kcal/m·hr·°C., volume resistivity $10^{14}$ Ω·cm, hereinafter referred to as "BN") having an average particle diameter of 1.5 μm, calcium carbonate (thermal conductivity 1.0 Kcal/m·hr·°C., volume resistivity $10^{14}$ Ω·cm, hereinafter referred to as "CaCO$_3$") having an average particle diameter of 5.0 μm and alumina (volume resistivity $10^{16}$ Ω·cm, hereinafter referred to as "Al$_2$O$_3$") having an average particle diameter of 3.0 μm.

The obtained respective sheets were laminated with electrolytic copper foils (35 μm in thickness) by using a hot press for 10 minutes at 20 kg/cm$_2$ (gauge pressure), and printed boards as shown in FIG. 4 were produced. The properties and the heat resistance test results of the respective sheets are given in Table 2. In Comparative Examples 6 and 7, the adhesion with the copper foil was inadequate and it was impossible to use them as printed circuit boards.

TABLE 2

| Example or Comparative Example No. | Kind of Mixture, Etc. | Inorganic Filler Kind | Inorganic Filler Amount Added (wt %) | Properties of Sheet after Lamination | Heat Resistance Test 300° C., 3 Min. |
|---|---|---|---|---|---|
| Example 5 | Mixture (A) | BN | 20 | Good | A |
| Example 6 | Mixture (A) | CaCO$_3$ | 40 | Good | A |
| Example 7 | Mixture (B) | Al$_2$O$_3$ | 40 | Good | A |
| Example 8 | Mixture (B) | Al$_2$O$_3$ | 60 | Good | A |
| Example 9 | Mixture (C) | Al$_2$O$_3$ | 40 | Good | A |
| Comparative Example 6 | EAA | Al$_2$O$_3$ | 40 | Good | A |
| Comparative Example 7 | GMA | Al$_2$O$_3$ | 40 | Good | X |
| Comparative Example 8 | GMA | BN | 20 | Gels formed, sheet forming impossible (crosslinking degree: 70 wt %) | * |

*Not measured

EXAMPLES 10–19 AND COMPARATIVE EXAMPLES 9–13

The resin or mixture and glass fiber set forth in Table 3 were dry blended using the amount added set forth in Table 3 in a Henschel mixer for 5 minutes. The obtained respective mixtures were extruded using an extruder equipped with a T-die (diameter 40 mm, die width 30 mm, rotation 85 rpm) at the same cylinder temperature and die temperature as those in Example 3 to form sheets (500 μm in thickness). The thus obtained respective sheets were crosslinked by using a hot press at 300° C. at 20 kg/cm$^2$ (gauge pressure) for 10 minutes to produce sheets as shown in FIG. 5. The obtained sheets were tested for the heat resistance. The results are given in Table 3.

The sheet obtained in Example 12 was measured for the volume resistivity, dielectric constant (1 MHz), dielectric loss tangent and withstand voltage according to ASTM D-257.

The volume resistivity was $10^{15}$ Ω·cm, the dielectric constant was 2.6, the dielectric loss tangent was 0.02 and the withstand voltage was 25 kV/mm.

It is clear from the results of Table 3 that the thin-wall body of this invention has not only excellent heat resistance but also good electrical insulating properties and thus is very useful for printed circuit boards.

TABLE 3

| Example or Comparative Example No. | Kind of Mixture, etc. | Glass Fiber Amount Added (wt %) | Length (mm) | Heat Resistance Test 300° C., 3 Min. |
|---|---|---|---|---|
| Example 10 | Mixture (A) | 50 | 2 | A |
| Example 11 | Mixture (A) | 50 | 5 | A |
| Example 12 | Mixture (A) | 50 | 10 | A |
| Example 13 | Mixture (B) | 50 | 10 | A |
| Example 14 | Mixture (B) | 10 | 5 | A |
| Example 15 | Mixture (B) | 20 | 5 | A |
| Example 16 | Mixture (B) | 100 | 5 | A |
| Example 17 | Mixture (B) | 150 | 5 | A |
| Example 18 | Mixture (C) | 50 | 5 | A |
| Example 19 | Mixture (C) | 100 | 10 | A |
| Comparative Example 9 | Mixture (A) | 0 | — | A |
| Comparative Example 10 | Mixture (A) | 2 | 5 | A |
| Comparative Example 11 | Mixture (A) | 300 | 5 | A |
| Comparative Example 12 | EEA | 50 | 5 | X |
| Comparative Example 13 | GMA | 50 | 5 | X |

EXAMPLES 20-24 AND COMPARATIVE EXAMPLES 14-18

Films (200 μm in thickness) obtained analogously to that of Examples 1 to 4 and Comparative Examples 1 to 5 were overlaid with a copper foil of 35 μm in thickness on top and a aramid fabric of 400 g/m² (hereinafter referred to as "Mat") (FIG. 8), a glass cloth of 400 g/m² (hereinafter referred to as "Cloth (1)38 ) (FIG. 6) as a plain weave glass cloth or a 6-layered cloth (hereinafter referred to as "Cloth (2)") obtained by overlaying 6 cloth to 600 g/m², each being of 100 g/m², on bottom, and crosslinked at 300° C. or 320° C. using a not press at 20 kg/cm² (gauge pressure) for 10 minutes to laminate the aforesaid film to a thickness of 1.6 mm, and thereby printed circuit boards were produced. The obtained respective boards were tested for the heat resistance under the aforesaid conditions.

Since the printed circuit boards obtained in Examples 20 to 24 were prepared in such way that the film melts to impregnate the glass cloth or aramid mat and thereafter it undergoes the condensation reaction while bonding to the copper foil, it was possible to produce flexible printed circuit boards uniformly filled with the glass cloth or aramid mat without the use of an adhesive.

For comparison, a heat resistance test similar to the above was conducted using a commercially available phenolic resin paper-based copper-clad laminate in Comparative Example 17 and a commercially available epoxy resin-impregnated glass cloth-based copper-clad laminate in Comparative Example 18. The results of the heat resistance test are set forth in Table 4.

TABLE 4

| Example or Comparative Example No. | Kind of Mixture, Etc. | Die Temperature (°C.) | Kind of the Glass Cloth or Mat | Bonding Temperature (°C.) | Heat Resistance Test 300° C. 3 min. |
|---|---|---|---|---|---|
| Example 20 | Mixture (A) | 140 | Mat | 300 | A |
| Example 21 | Mixture (B) | 160 | Mat | 320 | A |
| Example 22 | Mixture (B) | 180 | Cloth (1) | 300 | A |
| Example 23 | Mixture (C) | 140 | Cloth (1) | 320 | A |
| Example 24 | Mixture (C) | 140 | Cloth (2) | 320 | A |
| Comparative Example 14 | Mixture (A) | 140 | Not used | 320 | A |
| Comparative Example 15 | EAA | 140 | Cloth (1) | 300 | X |
| Comparative Example 16 | GMA | 140 | Cloth (1) | 300 | X |
| Comparative Example 17 | Phenolic resin paper-based Cu-clad base | | | | X |
| Comparative Example 18 | Epoxy resin impregnated glass cloth base | | | | X |

The film of 200 μm in thickness obtained in Example 22 was measured for the volume resistivity, dielectric constant (1 MHz), dielectric loss tangent and withstand voltage.

The volume resistivity was $10^{15}$ Ω·cm, the dielectric constant was 2.8, the dielectric loss tangent was 0.04 and the withstand voltage was 25 KV/mm.

EXAMPLES 25-30 AND COMPARATIVE EXAMPLES 19-21

Films (100 μm in thickness) obtained analogously to that of Examples 1 to 4 (or as in Comparative Examples 4 and 5 for Comparative Examples 19 and 20), respectively, were laminated with an electrolytic copper foil (17 μm in thickness) and a base board at 320° C. by a hot press at 20 kg/cm² (gauge pressure) for 10 minutes, as shown in FIG. 9 to produce each printed circuit board (Examples 25 to 28, and Comparative Examples 19 and 20).

Further, the same procedures as above were repeated using films (100 μm in thickness) obtained analogously to that of Example 1 (Examples 29 and 30) or to that of Comparative Example 5 (Comparative Example 21). In Comparative Example 21, the film and the base board were bonded using a conventionally used epoxy resin (adhesive) instead of heat-bonding.

The results of the heat resistance test on the printed circuit boards bonded (laminated) are set forth in Table 5.

In the column "Base Board" in Table 5, "A" stand for a commercially available epoxy resin glass cloth base (product corresponding to JIS C-6484 GE4), and "B" stands for a paper-based phenolic resin laminate (product corresponding to JIS C-6485 PP7F). "C" stands for a paper-based epoxy resin laminate (product corresponding to JIS C-6482) and "D" stands for a commercially available product of the same base as "A", but further lined with copper.

TABLE 5

| Example or Comparative Example No. | Base Board | Bonding Temperature (°C.) | Heat Resistance Test 300° C., 3 min. |
|---|---|---|---|
| Example 25 | A | 320 | A |
| Example 26 | A | 320 | A |
| Example 27 | A | 320 | A |
| Example 28 | A | 320 | A |
| Example 29 | B | 320 | A |
| Example 30 | C | 320 | A |
| Comparative Example 19 | A | 320 | X |
| Comparative Example 20 | A | 320 | X |
| Comparative Example 21 | D | — | X |

The film obtained in Example 25 was measured for the volume resistivity, dielectric constant (1 MHz), dielectric loss tangent and withstand voltage according to ASTM D-257.

The volume resistivity was $10^{14}$ Ω·cm, the dielectric constant was 3.2, the dielectric loss tangent was 0.08 and the withstand voltage was 20 KV/mm.

It is clear from the above results that the crosslinked product (thin-wall body obtained by heating and composition-training the mixture) of this invention has not only good adhesion between the copper foil and the thermosetting resin base, but also excellent heat resistance and good electrical insulating properties, and therefore can be used as an adhesive for thermosetting resin-based circuit boards.

EXAMPLES 31-34 AND COMPARATIVE EXAMPLES 22-26

Copper foil-laminated film obtained by laminating each film with an electrolytic copper foil (35 μm in thickness) using a laminate extruder equipped with a T-die under the conditions set forth in Table 6 was laminated with a polyimide film (trademark "Kapton" produced by du Pont, 25 μm in thickness) at 300° C. by a hot press at 20 kg/cm² (gauge pressure) as shown in FIG. 10, to produce each printed circuit board. The properties of the copper foil-laminated films obtained above are set forth in Table 6. Further, the results of the neat resistance test of the printed circuit boards bonded (laminated) are set forth in Table 7.

TABLE 6

| Example or Comparative Example No. | Kind of Mixture, Etc. | Cylinder Temperature $C_1$ (°C.) | Cylinder Temperature $C_2$ (°C.) | Die Temperature D (°C.) | Properties of the Film |
|---|---|---|---|---|---|
| Example 31 | Mixture (A) | 120 | 140 | 140 | Good film without gels or foaming |
| Example 32 | Mixture (A) | 120 | 140 | 160 | Good film without gels or foaming |
| Example 33 | Mixture (B) | 120 | 140 | 160 | Good film without gels or foaming |
| Example 34 | Mixture (C) | 120 | 140 | 160 | Good film without gels or foaming |
| Comparative Example 22 | Mixture (A) | 120 | 200 | 260 | Gels generated |
| Comparative Example 23 | Mixture (A) | 120 | 240 | 300 | Gels and foams generated |
| Comparative Example 24 | Mixture (A) | 120 | 240 | 330 | Gels abundantly formed, molding difficult |
| Comparative Example 25 | EAA | 120 | 140 | 140 | Good film |
| Comparative Example 26 | GMA | 120 | 140 | 140 | Good film |

TABLE 7

| Example or Comparative Example No. | Bonding Temperature (°C.) | Heat Resistance Test 300° C., 3 min. |
|---|---|---|
| Example 31 | 300 | A |
| Example 32 | 300 | A |
| Example 33 | 300 | A |
| Example 34 | 300 | A |
| Comparative Example 25 | 300 | X |
| Comparative Example 26 | 300 | X |

The film obtained in Example 33 was measured for the volume resistivity, dielectric constant (1 MHz), dielectric loss tangent and withstand voltage, according to ASTM D-257.

The volume resistivity was $10^{15}$ Ω·cm, the dielectric constant was 2.9, the dielectric loss tangent was 0.06, and the withstand voltage was 25 KV/mm.

It is clear from the above results that the thin-wall body of this invention has not only excellent adhesion to the copper foil and the polyimide film but also excellent heat resistance and good electrical insulating properties, and therefore can be used as an adhesive for polyimide film-based flexible printed circuit boards.

EXAMPLES 35-38 AND COMPARATIVE EXAMPLES 27-31

Films (50 μm in thickness) obtained analogously to those of Examples 1 to 4 and Comparative Examples 1 to 5 were laminated with an electrolytic copper foil (17 μm in thickness) and a polyester film (trademark "Mylar", produced by du Pont, 50 μm in thickness) at 250° C. by a hot press at 20 kg/cm² (gauge pressure) for 20 minutes as shown in FIG. 10 to produce each printed circuit board. The properties of the thus obtained films are given in Table 8. Further, when a heat resistance test was conducted on the printed boards bonded (laminated) at 250° C., no change was observed with any of those obtained in Examples 35 to 38, whereas with those obtained in Comparative Examples 30 and 31, such changes as peel-off, cracking, separation, etc., were observed between the polyester film and the adjacent layer, and within the copper circuit layer.

TABLE 8

| Example or Comparative Example No. | Kind of Mixture, Etc. | Cylinder Temperature $C_1$ (°C.) | Cylinder Temperature $C_2$ (°C.) | Die Temperature D (°C.) | Properties of the Film |
|---|---|---|---|---|---|
| Example 35 | Mixture (A) | 120 | 140 | 140 | Good film without gels or foaming |
| Example 36 | Mixture (A) | 120 | 140 | 160 | Good film without gels or foaming |
| Example 37 | Mixture (B) | 120 | 160 | 160 | Good film without gels or foaming |
| Example 38 | Mixture (C) | 120 | 140 | 160 | Good film without gels or foaming |
| Comparative Example 27 | Mixture (A) | 120 | 200 | 260 | Gels generated |
| Comparative Example 28 | Mixture (A) | 120 | 240 | 300 | Gels and foams generated |
| Comparative Example 29 | Mixture (A) | 120 | 240 | 330 | Gels abundantly formed, molding difficult |
| Comparative Example 30 | EAA | 120 | 140 | 140 | Good film |
| Comparative Example 31 | GMA | 120 | 140 | 140 | Good film |

The film obtained in Example 37 was measured for the volume resistivity, dielectric constant (1 MHz), dielectric loss tangent and withstand voltage according to ASTM D-257.

The volume resistivity was $10^{16}$ Ω·cm, the dielectric constant was 2.9, the dielectric loss tangent was 0.04 and the withstand voltage was 20 KV/mm.

It is clear from the above results that the thin-wall body of this invention not only has excellent adhesion to the copper foil and the polyester film, but also good electrical insulating properties, and therefore can be used as an adhesive for polyester film-based flexible printed circuit boards.

EXAMPLES 39–45 AND COMPARATIVE EXAMPLES 32–35

Films obtained analogously to those of Examples 1 to 4 and Comparative Examples 1 to 5 were overlaid with a copper foil of 35 μm in thickness and further with a metal foil as set forth in Table 9, and crosslinked at 320° C. using a hot press under a pressure of 20 kg/cm² (gauge pressure) for 10 minutes to produce metal core flexible printed circuit boards. A heat resistance test was conddcted on each of the films obtained. The results are set forth in Table 9. The printed circuit boards obtained in Examples 39 to 45 could be wound round a rod of 2 cm in diameter, and no abnormality was observed even after repeating this operation several times. However, the printed circuit boards obtained in Comparative Examples 32 and 33 could not be wound round the aforesaid rod. Further, when the printed circuit boards obtained in Comparative Examples 34 and 35 were wound round the aforesaid rod, peel-off was observed between the metal foil and the thin-wall body.

The film obtained in Example 41 was measured for the volume resistivity, dielectric constant (1 MHz), dielectric loss tangent and withstand voltage according to ASTM D-257.

The volume resistivity was $10^{15}$ Ω·cm, the dielectric constant was 2.8, the dielectric loss tangent was 0.06 and the withstand voltage was 25 KV/mm.

TABLE 9

| Comparative Example No. | Mixture, Etc. Kind | Mixture, Etc. Thickness (μm) | Metal Foil Kind | Metal Foil Thickness (μm) | Heat Resistance Test 300° C., 3 Min. |
|---|---|---|---|---|---|
| Example 39 | Mixture (A) | 60 | Aluminum foil | 10 | A |
| Example 40 | Mixture (A) | 60 | Aluminum foil | 30 | A |
| Example 41 | Mixture (A) | 60 | Aluminum foil | 60 | A |
| Example 42 | Mixture (A) | 60 | Copper foil | 30 | A |
| Example 43 | Mixture (B) | 60 | Copper foil | 35 | A |
| Example 44 | Mixture (B) | 200 | Aluminum foil | 10 | A |
| Example 45 | Mixture (C) | 60 | Aluminum foil | 30 | A |
| Comparative Example 32 | Mixture (A) | 60 | Aluminum plate | 1,000 | A |
| Comparative Example 33 | Mixture (A) | 60 | Iron plate | 200 | A |
| Comparative Example 34 | EAA | 60 | Aluminum foil | 30 | X |
| Comparative Example 35 | GMA | 60 | Aluminum foil | 30 | X |

EXAMPLES 46–49 AND COMPARATIVE EXAMPLES 36 & 37

Sheets obtained analogously to those of Examples 1 to 4 and Comparative Examples 4 to 5 were provided with masking on the part other than where a circuit was to be formed using a photoresist (trademark "Ristan", produced by du Pont) according to a photoresist masking method.

Each sheet obtained was plated using a chemical plating solution having the following composition in one liter of an aqueous solution at 72° C., to obtain a copper plating of about 35 μm on both surfaces of each sheet.

| CuSO$_4$.5H$_2$O | 10 g |
|---|---|
| EDTA-2Na.2H$_2$O | 30 g |
| HCHO (36%) | 3 ml |
| NaOH | 12 g |

After the completion of the plating, each sheet was washed to remove the aforesaid masking, then washed with water, and dried.

A heat resistance test was conducted on the obtained circuit-formed boards. The results are set forth in Table 10.

TABLE 10

| Example or Comparative Example No. | Mixture, Etc. Kind | Thickness (mm) | Heat Resistance Test |
|---|---|---|---|
| Example 46 | Mixture (A) | 0.2 | A |
| Example 47 | Mixture (A) | 0.4 | A |
| Example 48 | Mixture (B) | 1.0 | A |
| Example 49 | Mixture (C) | 1.0 | A |
| Comparative Example 36 | EAA | 1.0 | X |
| Comparative Example 37 | GMA | 1.0 | X |

It is clear from the above results that the printed circuit boards obtained by this invention not only have a very high circuit density, but also have excellent heat resistance and are soft, high quality printed circuit boards.

EXAMPLES 50-53 AND COMPARATIVE EXAMPLES 38 & 39

Films obtained analogously to those of Examples 1 to 4 and Comparative Examples 4 to 5 were crosslinked at 320° C. using a hot press under a pressure of 20 kg/cm$^2$ (gauge pressure) for 10 minutes to prepare sheets (of the thickness set forth in Table 11).

The sheets obtained were plated using a chemical plating solution having the following composition in one liter of an aqueous solution at 72° C. to obtain a copper plating of about 30 μm on both surfaces of each sheet.

| CuSO$_4$.5H$_2$O | 10 g |
|---|---|
| EDTA-2Na.2H$_2$O | 30 g |
| HCHO (36%) | 3 ml |
| NaOH | 12 g |

After the plating, washing with water and drying were conducted.

The double-sided copper-clad boards obtained were subjected to etching treatment in a conventional manner to prepare circuit boards having a test pattern. A heat resistance test was also conducted on the boards obtained. The results are set forth in Table 11.

TABLE 11

| Example or Comparative Example No. | Mixture, Etc. Kind | Thickness (mm) | Heat Resistance test |
|---|---|---|---|
| Example 50 | Mixture (A) | 0.2 | A |
| Example 51 | Mixture (A) | 0.4 | A |
| Example 52 | Mixture (B) | 0.2 | A |
| Example 53 | Mixture (C) | 0.2 | A |
| Comparative Example 38 | EAA | 0.2 | X |
| Comparative Example 39 | GMA | 0.2 | X |
| Example 39 | | | |

It is seen from these results that printed circuit boards obtained according to this invention not only have a very high circuit density, but also have excellent heat resistance and are soft and of a high quality.

EXAMPLES 54-57 AND COMPARATIVE EXAMPLES 40 & 41

Sheets obtained analogously to those of Examples 1 to 4 and Comparative Examples 4 to 5 were provided with masking on the part other than where a circuit was to be formed using a screen printing machine.

Platinum was deposited on the obtained sheets using a vacuum vapor depositing device (trademark "model JEE-4X", produced by Japan Electron Optics Lab. Co.) in 2×10$^{-6}$ Torr to obtain a platinum coat of about 1,000 Å in thickness.

A heat resistance test was conducted on the circuit boards obtained. The results are set forth in Table 12.

TABLE 12

| Example or Comparative Example No. | Mixture, Etc. Kind | Thickness (mm) | Heat Resistance Test |
|---|---|---|---|
| Example 54 | Mixture (A) | 0.2 | A |
| Example 55 | Mixture (A) | 0.4 | A |
| Example 56 | Mixture (B) | 1.0 | A |
| Example 57 | Mixture (C) | 1.0 | A |
| Comparative Example 40 | EAA | 1.0 | X |
| Comparative Example 41 | GMA | 1.0 | X |

It is seen from these results that the printed circuit boards obtained according to this invention not only have a very high circuit density, but also have excellent heat resistance and are soft, high-quality printed circuit boards.

EXAMPLES 58-61 AND COMPARATIVE EXAMPLES 42 & 43

Films obtained analogously to those of Examples 1 to 4 and Comparative Examples 4 to 5 were bond laminated with electrolytic copper foils (17 μm in thickness) on both surfaces as shown in FIG. 2 and crosslinked at 320° C. using a hot press under a pressure of 20 kg/cm$^2$ (gauge pressure) for 10 minutes to produce double-sided copper foil-clad laminates (of thicknesses as set forth in Table 13).

Each laminate obtained was provided with through holes of 0.5 mm of 1.0 mm in diameter and plating was effected on the through hole part using an electroless copper plating solution having the following composition to produce each copper plating of about 20 μm in film thickness.

| CuSO$_4$.5H$_2$O | 10 g |
|---|---|
| EDTA-2Na.2H$_2$O | 30 g |
| HCHO (36%) | 3 ml |
| NaOH | 12 g |

After the plating, washing with water and subsequent drying were conducted. Thereafter, a circuit was formed by firstly masking the circuit part by a screen printing machine in a conventional manner and removing the part other than the circuit by etching.

A heat resistance test was conducted on the circuit boards obtained. The results are set forth in Table 13.

TABLE 13

| Example or Comparative Example No. | Mixture, Etc. Kind | Thickness (mm) | Heat Resistance Test |
|---|---|---|---|
| Example 58 | Mixture (A) | 0.2 | A |
| Example 59 | Mixture (A) | 0.4 | A |
| Example 60 | Mixture (B) | 1.0 | A |
| Example 61 | Mixture (C) | 1.0 | A |
| Comparative Example 42 | EAA | 1.0 | X |
| Comparative Example 43 | GMA | 1.0 | X |

It is seen from these results that the printed circuit boards obtained by this invention not only have a very high circuit density, but also have excellent heat resistance and are soft, high-quality printed circuit boards.

EXAMPLES 62–64 AND COMPARATIVE EXAMPLES 44 & 45

Films obtained analogously to those of Examples 1, 3 and 4 and Comparative Examples 4 to 5 were overlaid with an electrolytic copper foil of 35 μm in thickness on top and an aluminum plate of the thickness set forth in Table 14 on bottom and crosslinked at 320° C. using a hot press at 20 kg/cm² (gauge pressure) for 10 minutes to produce each copper-clad board for the production of hybrid integrated circuit boards. The boards obtained were provided with etching (ammonium persulfate etching) to give a test pattern shown in UL 796 (Printed Circuit Boards) FIG. 7.1.

The boards obtained were subjected to a heat resistance test, a bending test by a V-die (groove width 70 mm, angle 90°, sample width 50 mm) and a square cylinder single-drawing test (no flange) (drawing depth 2 mm, corner radius 5 mm). The results of the heat resistance test are given in Table 14.

TABLE 14

| Example or Comparative Example No. | Kind of Mixture, Etc. | Thickness of Aluminum Plate (μm) | Heat Resistance Test |
|---|---|---|---|
| Example 62 | Mixture (A) | 50 | A |
| Example 63 | Mixture (B) | 200 | A |
| Example 64 | Mixture (C) | 200 | A |
| Comparative Example 44 | EAA | 200 | X |
| Comparative Example 45 | GMA | 200 | X |

As the result of the V-bending and drawing tests, the boards for printing obtained by Examples 62 to 64 did not show any disconnection of the copper circuit and were able to be processed by V-bending and drawing. Further, no peel-off was observed at the corner. On the contrary, the board obtained in Comparative Example 44 showed peel-off at the corner part on V-bending, and when drawing, the copper foil and the aluminum separated. Further, the board obtained in Comparative Example 45 showed peel-off at the corner part on V-bending, and the circuit was cut on drawing.

EXAMPLES 65–68 AND COMPARATIVE EXAMPLES 46–50

Films obtained analogously to those of Examples 1 to 4 and Comparative Examples 1 to 5 were laminated with an electrolytic copper foil (17 μm in thickness) and a polyether ether ketone film (50 μm in thickness) at 300° C. using a hot press under a pressure of 20 kg/cm² (gauge pressure) for 10 minutes as shown in FIG. 10 to produce each printed board. The properties of the films are given in Table 15. Further, when a heat resistance test was conducted on the printed circuit boards bonded (laminated) at 300° C., no change was observed with any of those obtained in Examples 65 to 68, whereas with those obtained in Comparative Examples 46 and 50, changes such as peel-off, cracking, separation, etc., were observed between the polyether ether ketone film and the adjacent layer, and within the copper circuit.

TABLE 15

| Example or Comparative Example No. | Kind of Mixture, Etc. | Cylinder Temperature $C_1$ (°C.) | Cylinder Temperature $C_2$ (°C.) | Die Temperature D (°C.) | Properties of the Film |
|---|---|---|---|---|---|
| Example 65 | Mixture (A) | 120 | 140 | 140 | Good film without gels or foaming |
| Example 66 | Mixture | 120 | 140 | 160 | Good film without gels or foaming |
| Example 67 | Mixture (B) | 120 | 160 | 200 | Good film without gels or foaming |
| Example 68 | Mixture (C) | 120 | 140 | 160 | Good film without gels or foaming |
| Comparative Example 46 | Mixture (D) | 120 | 160 | 240 | Gels generated |
| Comparative Example 47 | Mixture (D) | 120 | 240 | 300 | Gels and foams generated |
| Comparative Example 48 | Mixture (D) | 120 | 240 | 330 | Gels abundantly formed, molding difficult |
| Comparative Example 49 | EAA | 120 | 140 | 140 | Good film |
| Comparative Example 50 | GMA | 120 | 140 | 140 | Good film |

EXAMPLES 69–72

Printed boards were produced in a manner similar to that in Example 65 except tnat the polyether ether ketone film used in Example 65 was replaced by films of polyetriazine, poly-p-phenylene phthalamide, polyoxymethylene, and polyether sulfone of 50 μm thickness, respectively.

Further, when the heat resistance test was conducted on the printed board bonded (laminated) at 300° C., none of them showed any change, as was the case for Example 65.

The film obtained in Example 71 was measured for the volume resistivity, dielectric constant (1 MHz), dielectric loss tangent and withstand voltage according to ASTM D-257.

The volume resistivity was $10^{16}$ Ω·cm, the dielectric constant was 3.0, the dielectric loss tangent was 0.04, and the withstand voltage was 20 KV/mm.

It is clear from the above results that the thin-wall body of this invention not only have excellent adhesion to the copper foil and the heat resistant polymer films, but also have excellent heat resistance and good electrical insulating properties, and therefore can be used as an adhesive for heat resistant polymer-based flexible printed circuit boards.

The printed circuit boards obtained by this invention have the following features:

(1) Since an adhesive of a thermosetting resin such as an epoxy resin is not used, a step of bonding is omitted, and complication attendant steps (drying, etc.) are also eliminated.

(2) The electrical characteristics (e.g., insulating properties, dielectric strength, dielectric loss tangent functions, etc.) are excellent.

(3) The heat resistance is good, and not only they can stand a temperature of 250° C. or higher so that they can be solderred, but also by compression-treating at a temperature of 100° C. or higher, an electrically conductive metal thin film obtained by electroless plating or electroplating may be satisfactorily bonded to the board without the use of the aforesaid adhesive.

(4) The chemical resistance is good.

(5) In particular, the feature of the printed circuit boards of this invention is that they can be treated to form crosslinks at a relatively high temperature (200° C. or higher) as compared with the case where a polyimide film or a polyester film is used alone.

(6) The moisture resistance is excellent (the degree of water absorption is small).

(7) The tensile strength and the tear strength are great.

(8) In particular, because of the feature (5) above, not only is the dimensional stability excellent, but also the adhesion between layers A and B and the other layers is good even at high temperatures, and further the number of voids remaining is extremely small.

(9) Since it is not necessary to coat a primer used when bonding a thermoplastic resin film which is an insulating material and a metal foil or a metal plate for producing ordinary printed circuit boards, the laminating step may be easily conducted.

Further, the printed circuit boards thus obtained may be subjected to bend processing and draw processing. The thus processed printed circuit boards (hybrid integrated circuit boards) have the following features:

(1) The heat dissipating properties of the metal plate are effectively utilized and the reliability of the insulating film is remarkably increased.

(2) The processability is good, and bend processing and draw processing are possible, thus simplifying the production process.

(3) Although the primer is not used, the adhesion of the crosslinked product to the metal plate or the metal foil is remarkably excellent, and furthermore, since the crosslinking capabillty is retained even at high temperatures (about 360° C.), the adhesion at high temperatures is excellent.

(4) As in the case of conventional printed circuit boards, it is possible to form a circuit by etching, and thereafter conducting bend processing, or draw processing using a mold.

As described above, the printed circuit boards of this invention possess good dimensional stability, heat resistance, chemical resistance, moisture resistance, etc., as well as the electrical characteristics such as insulation resistance, dielectric constant, etc., required for printed circuit boards, and also the folding endurance of the flexible boards exhibits flexibility which has not hitherto been obtained with the conventional boards. Further, good adhesion with the metal foil is obtained by heat contact bonding at up to relatively high temperatures (about 360° C.).

Since the printed circuit boards and products incorporating such obtained according to this invention manifest the above-described features, they may be used as hybrid IC (integrated circuit) boards, electrically insulating heat-conductive boards for semiconductors, boards for switching regulators, boards for chip carriers, boards for thyristors, boards for transistor arrays, etc.

Wnile the invention has been described in detail and with reference to specific embodiments thereof, it will be apparent to one skilled in the art that various changes and modifications can be made therein without departing from the spirit and scope thereof.

What is claimed is:

1. A printed circuit board which comprises a laminate of:
   (A) a thin-wall body having a thickness of from 0.2 μm to less than 5 mm and containing a cross-linked product of a mixture of (a) 1 to 99 wt% of an ethylenic copolymer (A) comprised of 30 to 99.5 wt% of ethylene, and an oxirane ring-containing compound having at least one double bond and having 6 to 30 carbon atoms, and wherein the content of said oxirane ring-containing compound in the ethylenic copolymer (A) is from 0.1 to 70 wt% and (b) 99 to 1 wt % of an ethylenic copolymer (B) comprised of 30 to 99.5 wt % of an ethylene, and a comonomer selected from the group consisting of unsaturated monocarboxylic acids, unsaturated dicarboxylic acids, unsaturated dicarboxylic acid anhydrides, and half esters of unsaturated dicarboxylic acids and wherein the total content of said comonomer in the ethylenic copolymer (B) is from 0.1 to 70 wt %; and
   (B) an electrically conductive metal layer having a thickness of from 100 Å to 400 μm.

2. A printed circuit board as in claim 1, which further comprises
   (C) a thermosetting resin layer having a thickness of from 0.6 to 4 mm, and the electrically conductive metal layer and the themosetting layer are laminated via the thin-wall body between the electrically conductive metal layer (B) and the thermosetting layer (C).

3. A printed circuit board as in claim 1, which further comprises (D) a heat-resistant thermoplastic polymer layer having a glass transition temperature of 100° to 400° C. and a thickness of from 20 μm to 2 mm; and the electrically conductive metal layer and the heat resistant polymer layer are laminated via the thin-wall body between the electrically conductive metal layer (B) and the heat resistant polymer layer (D).

4. A printed circuit board as in claim 1, which further comprises (E) an electrically conductive metal layer having a thickness of from 5 μm to 3 mm; and said electrically conductive metal layers (B) and (E) are laminated via the thin-wall body between said electrically conductive metal layers (B) and (E).

5. A printed circuit board as in claim 1, which further comprises at least one layer of a glass cloth or mat (F), an aramid fiber sheet (G) and a ceramic sheet (H) and wherein the thin-wall body is between said electrically conductive metal layer (B) and said at least one layer (F), (G) or (H).

6. A printed circuit board as in claim 1, wherein the ethylenic copolymer (A) is a copolymer of ethylene and an oxirane ring-containing compound represented by formulae (I) to (III)

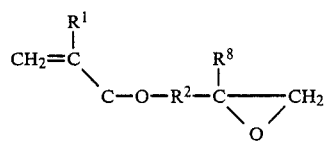
(I)

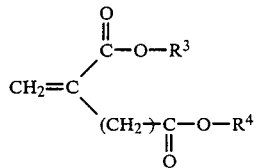
(II)

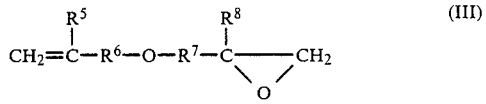
(III)

wherein $R^1$, $R^5$ and $R^8$ which may be the same or different, each represents a hydrogen atom or a methyl group, $R^2$, $R^6$ and $R^7$ which may also be the same or different, each represents a straight chain or branched chain alkylene group having 1 to 12 carbon atoms, $R^3$ and $R^4$ each represents a straight chain or branched chain alkyl group having up to 12 carbon atoms and a straight chain or branched chain alkyl group having 2 to 12 carbon atoms and having an oxirane group at the terminal, provided that at least one of $R^3$ and $R^4$ has the alkyl group having an oxirane group, and n is 0 or 1; or a copolymer of ethylene, the oxirane ring-containing compound and a comonomer (3) selected from the group consisting of unsaturated carboxylic acid esters containing up to 30 carbon atoms and vinyl esters containing up to 30 carbon atoms.

7. A printed circuit board as in claim 1, wherein the ethylenic copolymer (B) is (i) a copolymer of ethylene and at least one comonomer (2) selected from the group consisting of unsaturated monocarboxylic acids containing up to 25 carbon atoms, unsaturated dicarboxylic acids containing 4 to 50 carbon atoms and anhydrides of the unsaturated dicarboxylic acids; (ii) a copolymer of ethylene, the comonomer (2) and a comonomer (3) selected from the group consisting of unsaturated carboxylic acid ester containing up to 30 carbon atoms and vinyl esters containing up to 30 carbon atoms; or (iii) products obtained by hydrolysis or alcohol modification of the copolymer (i) or (ii) having the acid anhydride group.

8. A printed circuit board as in claim 1, wherein the mixing ratio of the ethylenic copolymer (A) to the ethylenic copolymer (B) is from 10/90 to 90/10 by weight.

9. A printed circuit board as in claim 1, wherein the content of said oxirane ring-containing compound in the ethylenic copolymer (A) is from 0.5 to 40 wt %, and the total content of said comonomer in the ethylenic copolymer (B) is from 0.5 to 40 wt%.

* * * * *